(12) United States Patent
Yokogawa et al.

(10) Patent No.: US 8,785,965 B2
(45) Date of Patent: Jul. 22, 2014

(54) NITRIDE-BASED SEMICONDUCTOR LIGHT-EMITTING DEVICE AND METHOD FOR FABRICATING THE SAME

(75) Inventors: Toshiya Yokogawa, Nara (JP); Ryou Kato, Osaka (JP)

(73) Assignee: Panasonic Corporation, Osaka (JP)

( * ) Notice: Subject to any disclaimer, the term of this patent is extended or adjusted under 35 U.S.C. 154(b) by 123 days.

(21) Appl. No.: 12/739,972

(22) PCT Filed: Sep. 7, 2009

(86) PCT No.: PCT/JP2009/004415
§ 371 (c)(1),
(2), (4) Date: Apr. 27, 2010

(87) PCT Pub. No.: WO2010/029720
PCT Pub. Date: Mar. 18, 2010

(65) Prior Publication Data
US 2010/0244063 A1    Sep. 30, 2010

(30) Foreign Application Priority Data
Sep. 9, 2008  (JP) .................................. 2008-231456

(51) Int. Cl.
*H01L 33/00*  (2010.01)

(52) U.S. Cl.
USPC ............... 257/101; 257/94; 257/96; 257/102; 257/103; 257/E33.025; 257/E33.028; 257/E33.03; 257/E33.033; 257/E33.034

(58) Field of Classification Search
CPC .......................... H01L 33/007; H01L 33/0075

USPC .............. 257/94, 96, 101, 102, 103, E33.025, 257/E33.028, E33.03, E33.033, E33.034
See application file for complete search history.

(56) References Cited

U.S. PATENT DOCUMENTS

| 6,586,774 B2 * | 7/2003 | Ishibashi et al. ................ 257/94 |
| 6,927,426 B2 * | 8/2005 | Matsuoka et al. ............ 257/103 |
| 2002/0081763 A1 | 6/2002 | Ishibashi et al. |

(Continued)

FOREIGN PATENT DOCUMENTS

| JP | 2001-024221 A | 1/2001 |
| JP | 2001-097800 | 4/2001 |

(Continued)

OTHER PUBLICATIONS

International Search Report for related International Application No. PCT/JP2010/007112 mailed Mar. 1, 2011.

(Continued)

*Primary Examiner* — Jay C Kim
(74) *Attorney, Agent, or Firm* — Renner, Otto, Boisselle & Sklar, LLP

(57) ABSTRACT

A nitride-based semiconductor light-emitting device according to the present invention has a nitride-based semiconductor multilayer structure 50. The nitride-based semiconductor multilayer structure 50 includes: an active layer 32 including an $Al_aIn_bGa_cN$ crystal layer (where $a+b+c=1$, $a\geq 0$, $b\geq 0$ and $c\geq 0$); an $Al_dGa_eN$ overflow suppressing layer 36 (where $d+e=1$, $d>0$, and $e\geq 0$); and an $Al_fGa_gN$ layer 38 (where $f+g=1$, $f\geq 0$, $g\geq 0$ and $f<d$). The $Al_dGa_eN$ overflow suppressing layer 36 is arranged between the active layer 32 and the $Al_fGa_gN$ layer 38. And the $Al_dGa_eN$ overflow suppressing layer 36 includes an In-doped layer that is doped with In at a concentration of $1\times 10^{16}$ atms/cm$^3$ to $1\times 10^{19}$ atms/cm$^3$.

10 Claims, 22 Drawing Sheets

(56) References Cited

U.S. PATENT DOCUMENTS

| | | |
|---|---|---|
| 2003/0203629 A1 | 10/2003 | Ishibashi et al. |
| 2004/0056259 A1 | 3/2004 | Goto et al. |
| 2005/0142682 A1 | 6/2005 | Ishibashi et al. |
| 2007/0096142 A1 | 5/2007 | Tachibana et al. |
| 2008/0142821 A1 | 6/2008 | Sakamoto et al. |
| 2008/0151957 A1 | 6/2008 | Tachibana et al. |
| 2008/0251781 A1* | 10/2008 | Han et al. .................. 257/13 |
| 2009/0166649 A1 | 7/2009 | Lee |
| 2009/0173962 A1 | 7/2009 | Hanawa et al. |
| 2009/0179190 A1 | 7/2009 | Nakahara et al. |
| 2010/0032644 A1 | 2/2010 | Akita et al. |
| 2010/0102296 A1 | 4/2010 | Tachibana et al. |
| 2010/0244040 A1 | 9/2010 | Yokoyama et al. |

FOREIGN PATENT DOCUMENTS

| | | |
|---|---|---|
| JP | 2001-308462 | 11/2001 |
| JP | 2002-076519 | 3/2002 |
| JP | 2002-141552 A | 5/2002 |
| JP | 2002-198314 | 7/2002 |
| JP | 2003-309074 | 10/2003 |
| JP | 2003-332697 | 11/2003 |
| JP | 2004-063537 | 2/2004 |
| JP | 2007-066981 A | 3/2007 |
| JP | 2008-198952 | 8/2008 |
| JP | 2009-239075 A | 10/2009 |
| WO | 2007/138656 A1 | 12/2007 |

OTHER PUBLICATIONS

Form PCT/ISA/237 and partial English translation for related International Application No. PCT/JP2010/007112 dated Mar. 1, 2011.

Search Report for corresponding International Application No. PCT/JP2009/004415 mailed Oct. 6, 2009.

Form PCT/ISA/237 and partial English translation for International Application No. PCT/JP2009/004415 dated Oct. 6, 2009.

Y. Oshima et al., "Fabrication of Freestanding GaN Wafers by Hydride Vapor-Phase Epitaxy with Void-Assisted Separation", phys. Stat. sol.(a) 194, No. 2, pp. 554-558 (2002).

Kensaku Motoki et al., "Preparation of Large Freestanding GaN Substrates by Hydride Vapor Phase Epitaxy Using GaAs as a Starting Substrate", Jpn. J. Appl. Phys., vol. 40 (2001), pp. L140-L143 Part 2, No. 2B, Feb. 15, 2001).

Office Action for related U.S. Appl. No. 13/203,786, filed Aug. 29, 2011.

Office Action for related U.S. Appl. No. 13/203,786 mailed on Sep. 25, 2013.

Notice of Reasons for Rejection mailed Apr. 15, 2014 for corresponding Japanese Patent Application No. 2011-545083 and partial English translation.

* cited by examiner

FIG. 2
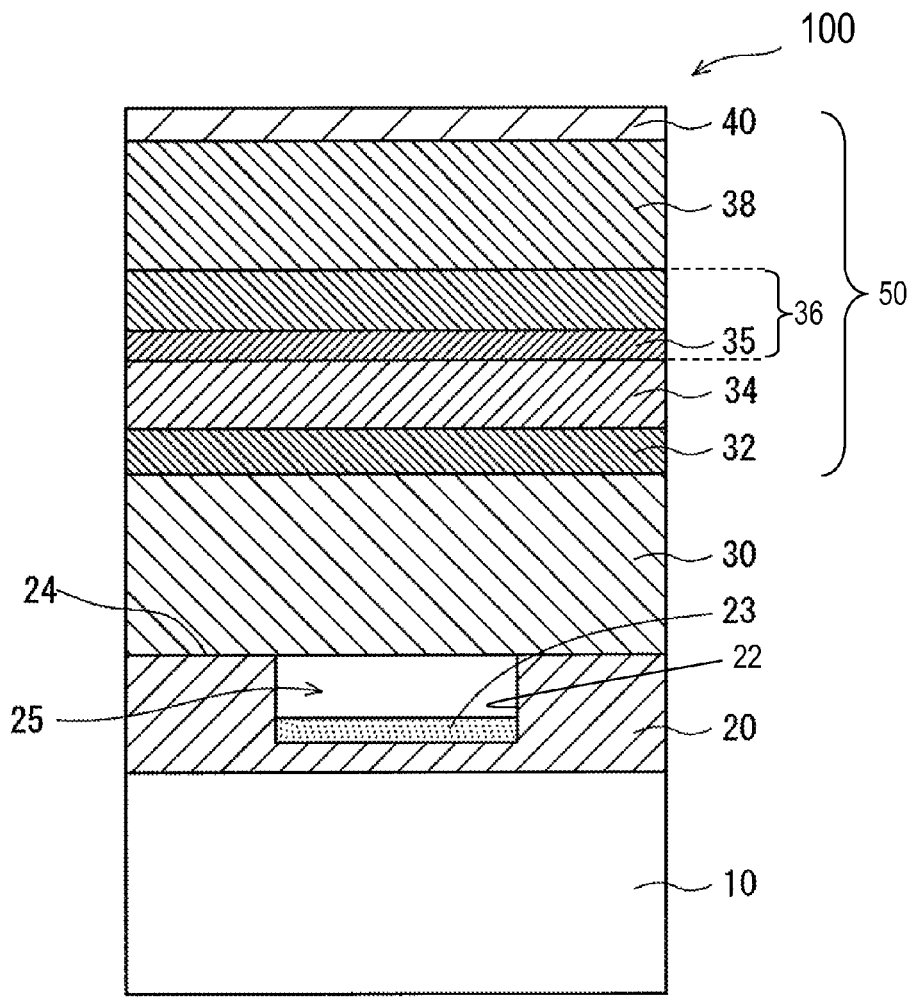
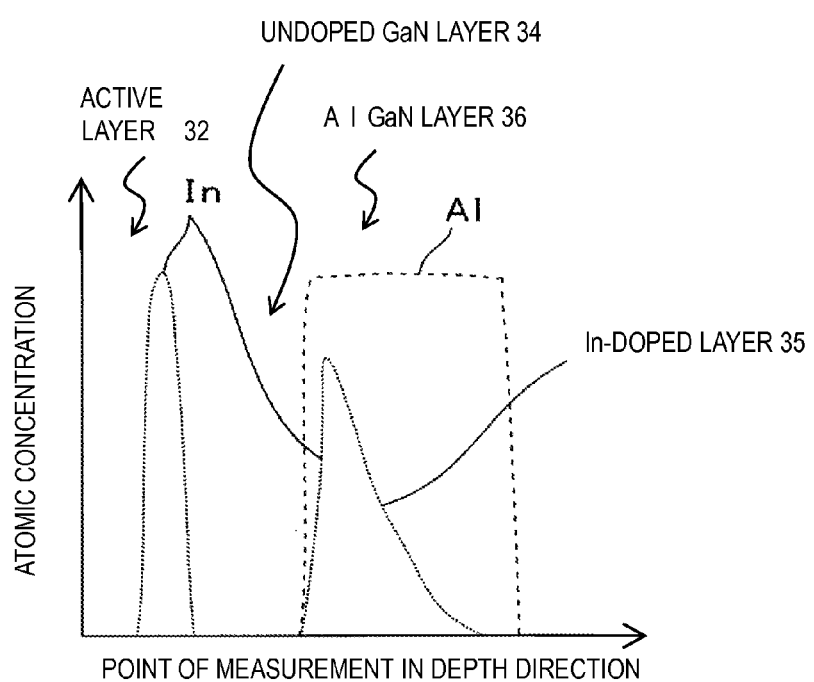

FIG.3
(a)
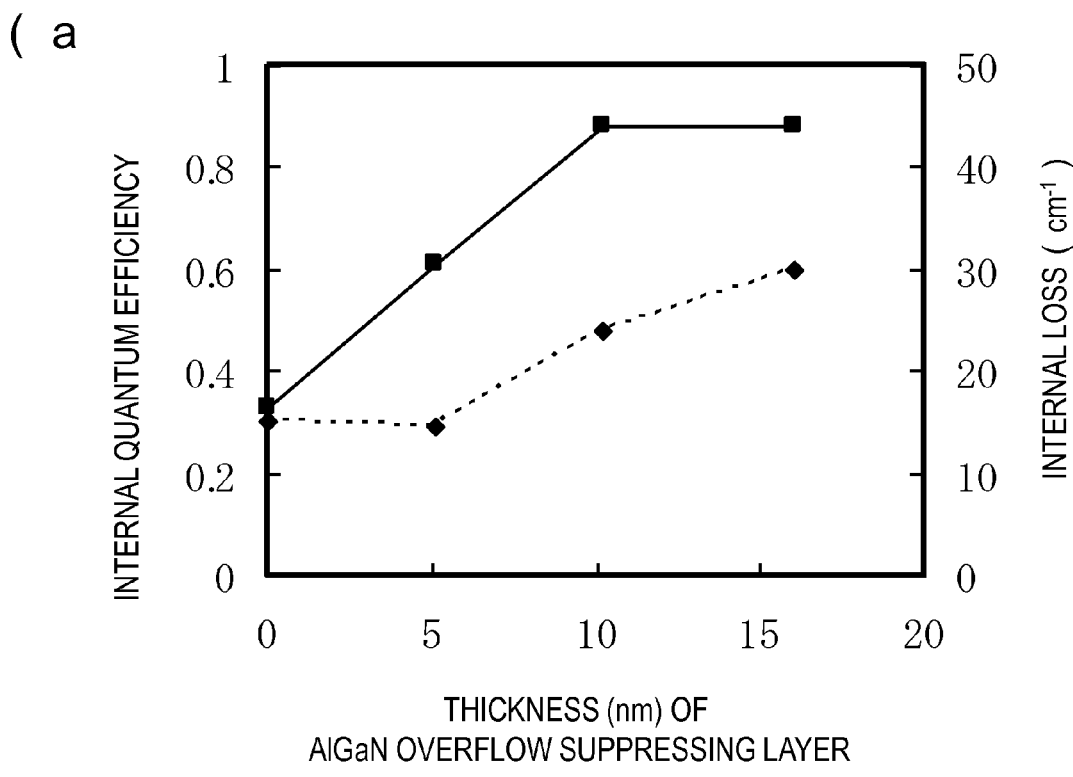
THICKNESS (nm) OF
AlGaN OVERFLOW SUPPRESSING LAYER
(b)
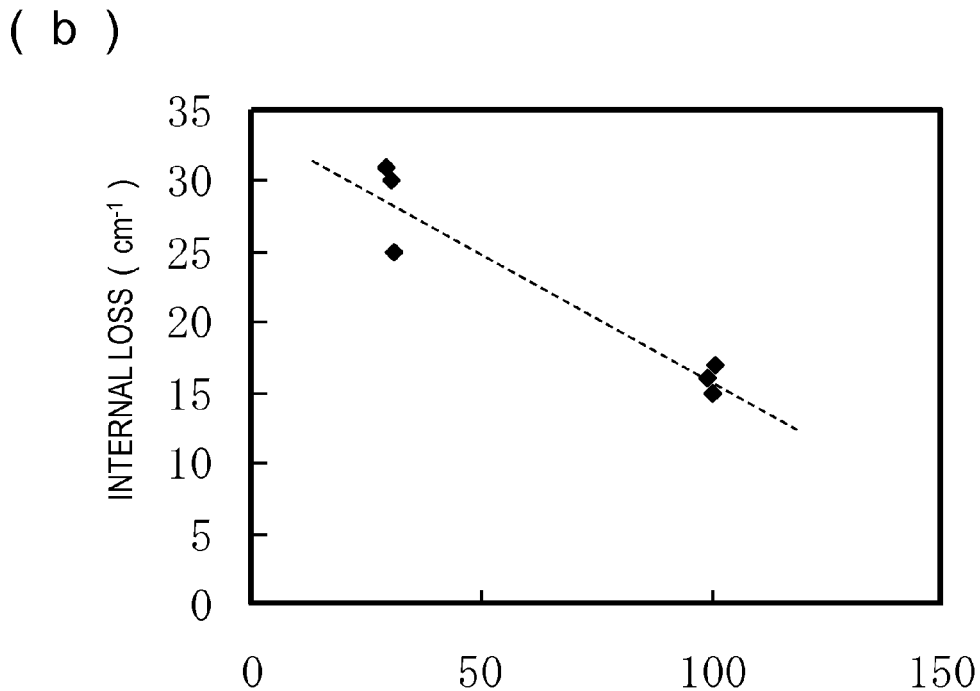
INTERVAL (nm) BETWEEN AlGaN OVERFLOW SUPPRESSING LAYER AND
InGaN ACTIVE LAYER (THICKNESS OF THEIR INTERMEDIATE LAYER)

FIG.5
(a)
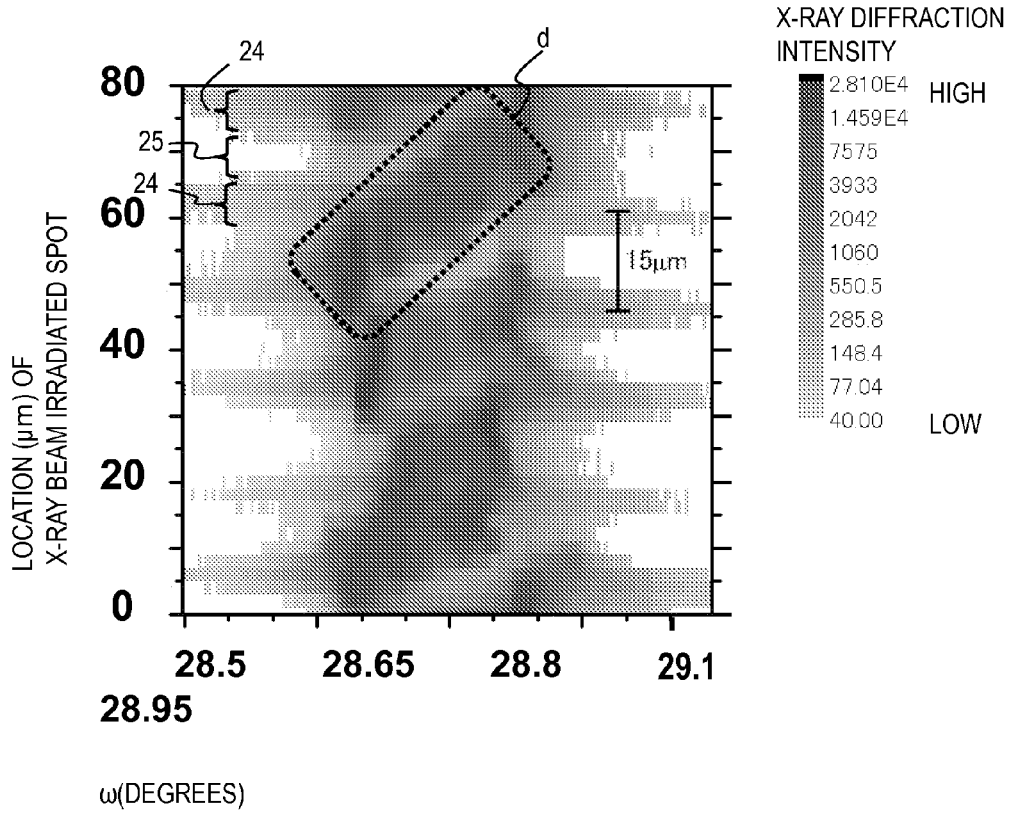
(b)
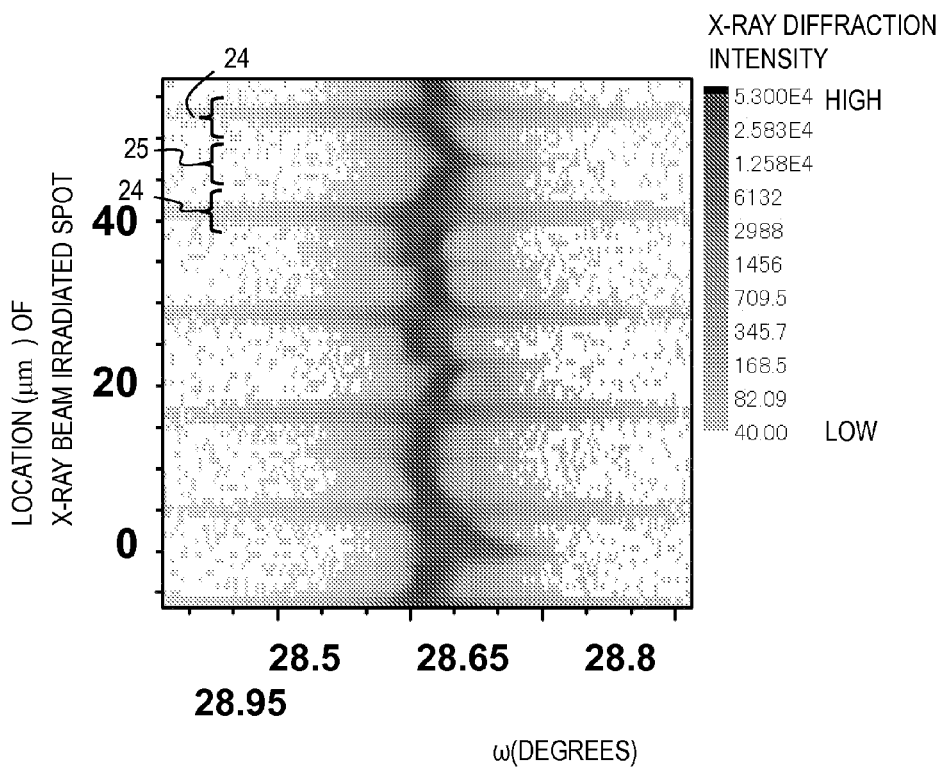

*FIG.6*
(a)
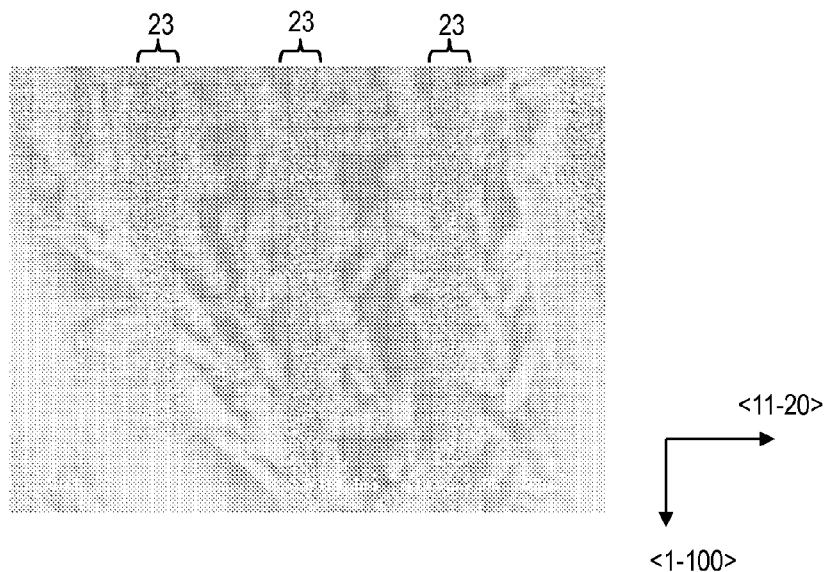
(b)

FIG. 9
(a)
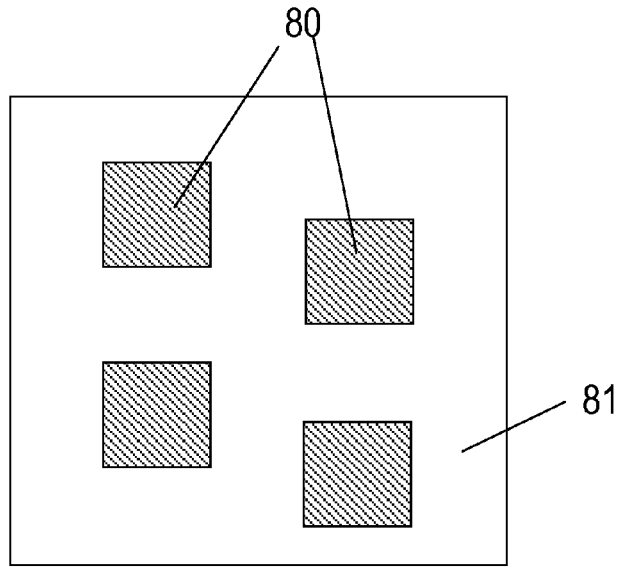
(b)
IF InGaN QW AND AlGaN OFS
WERE JUST GROWN THEREON
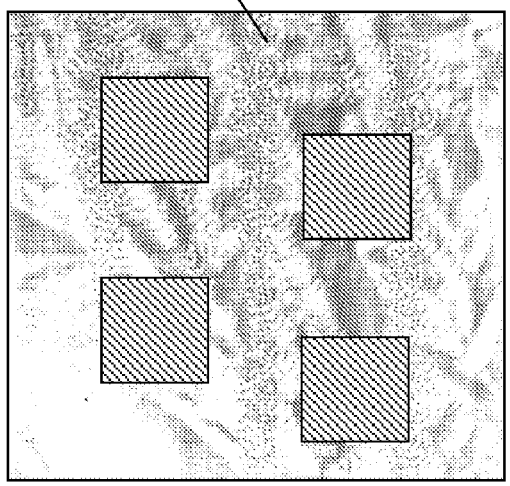
COMPRESSIVE STRAIN WAS
PRODUCED UNEVENLY
(c)
IF In WAS ADDED TO PORTION OF
AlGaN OFS CLOSEST TO
ACTIVE LAYER
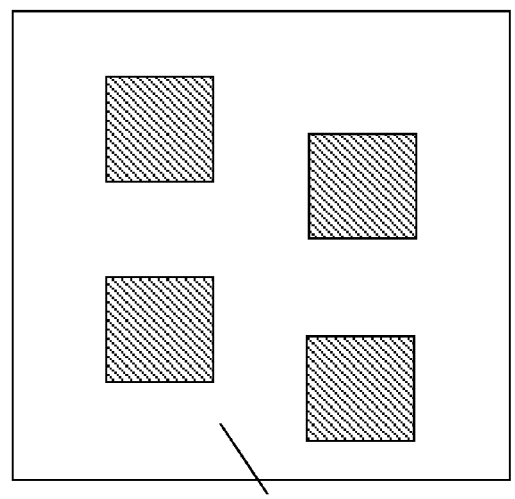
COMPRESSIVE STRAIN WAS PRODUCED
UNIFORMLY WITH DECREASED UNEVENNESS

FIG.11
(a)
THIS EMBODIMENT
NON-UNIFORM STRAIN DISTRIBUTION
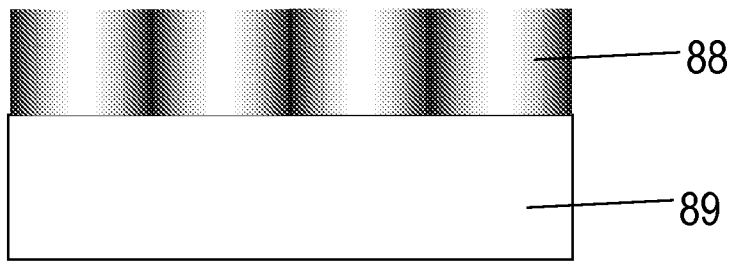
ADD In TO PORTION OF
AlGaN OFS CLOSEST TO ACTIVE LAYER
(b)
SMOOTH OUT THE NON-UNIFORM
STRAIN DISTRIBUTION
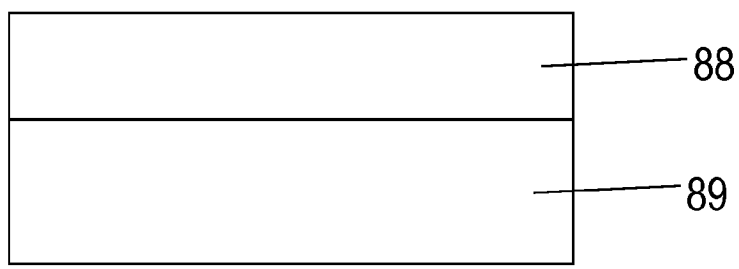
STRAIN DOES EXIST

FIG.14
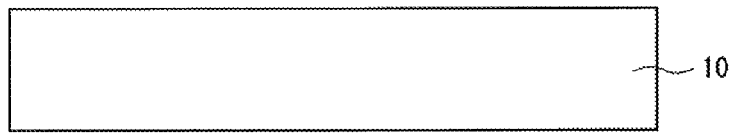
|  | COMPARATIVE EXAMPLE #1 | COMPARATIVE EXAMPLE #2 | THIS EMBODIMENT |
|---|---|---|---|
| EXCITED AT 383 nm | 1 | 0.78 | 1.8 |
| EXCITED AT 366nm | 4.9 | 6.0 | 9.3 |
FIG.15
(a)
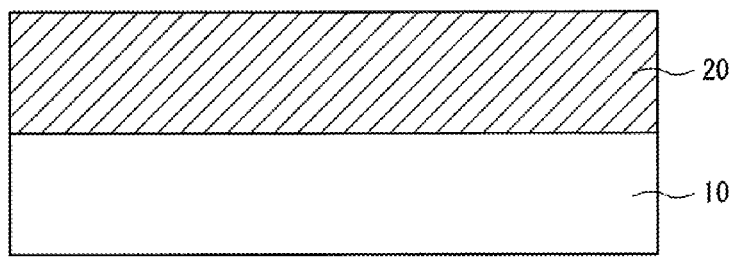
(b)
(c)
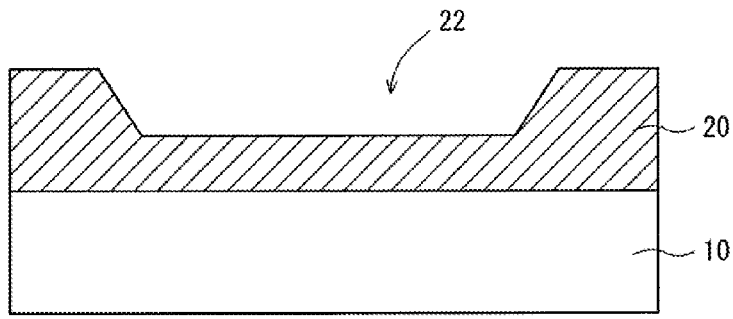

FIG.16
(a)
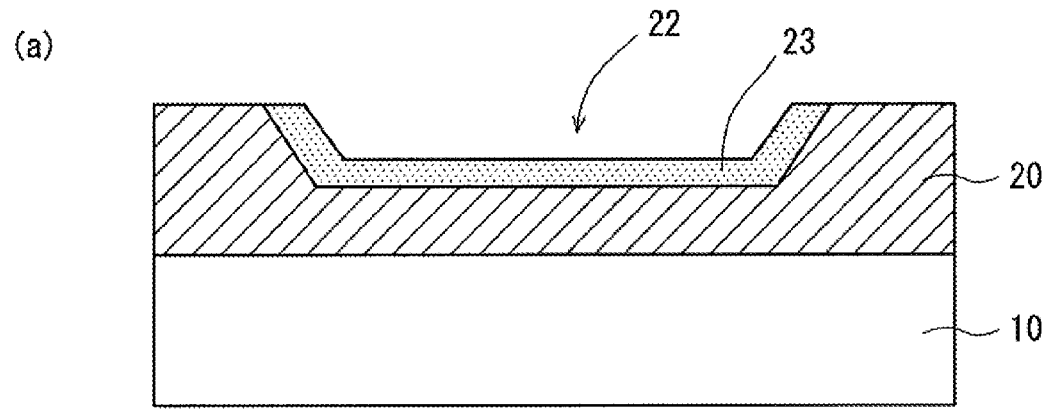
(b)
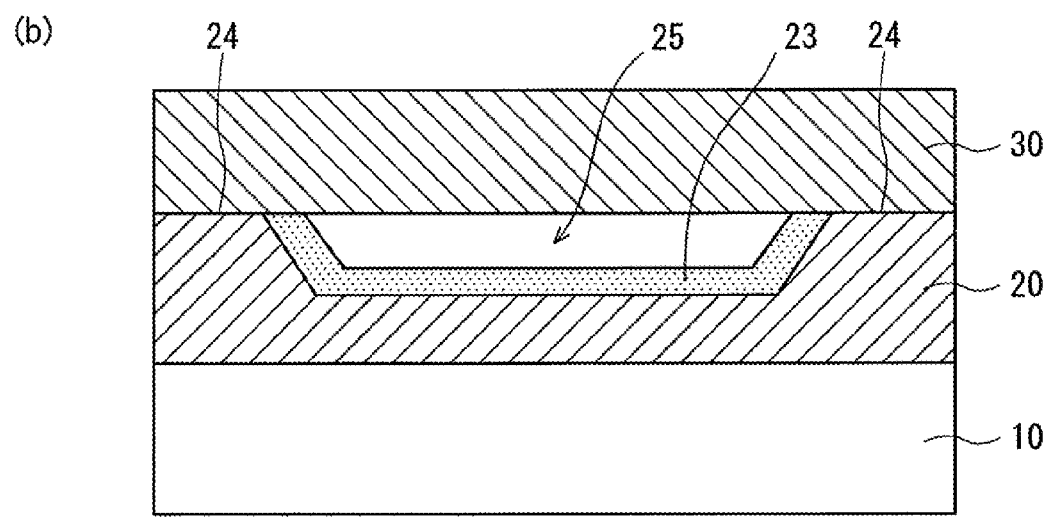

FIG.17
(a)
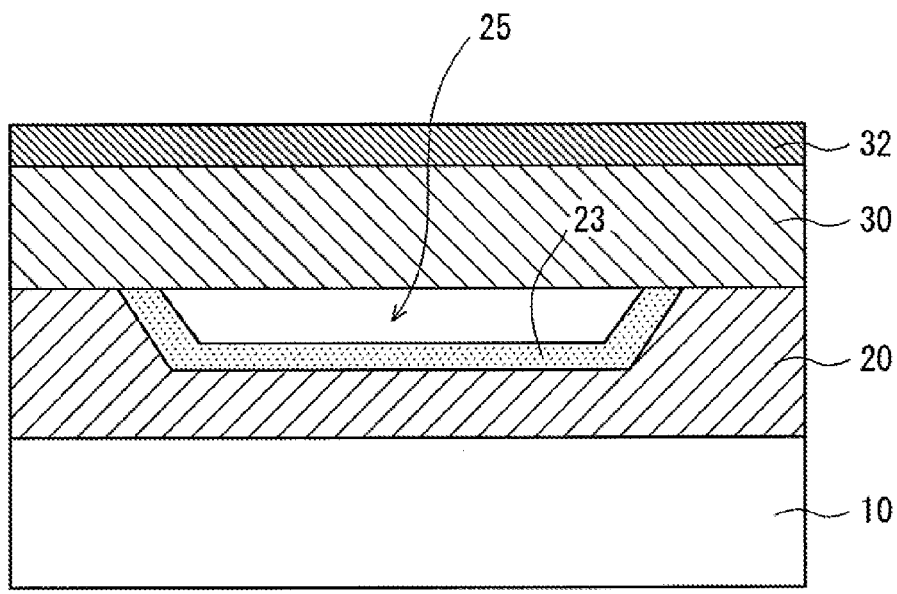
(b)
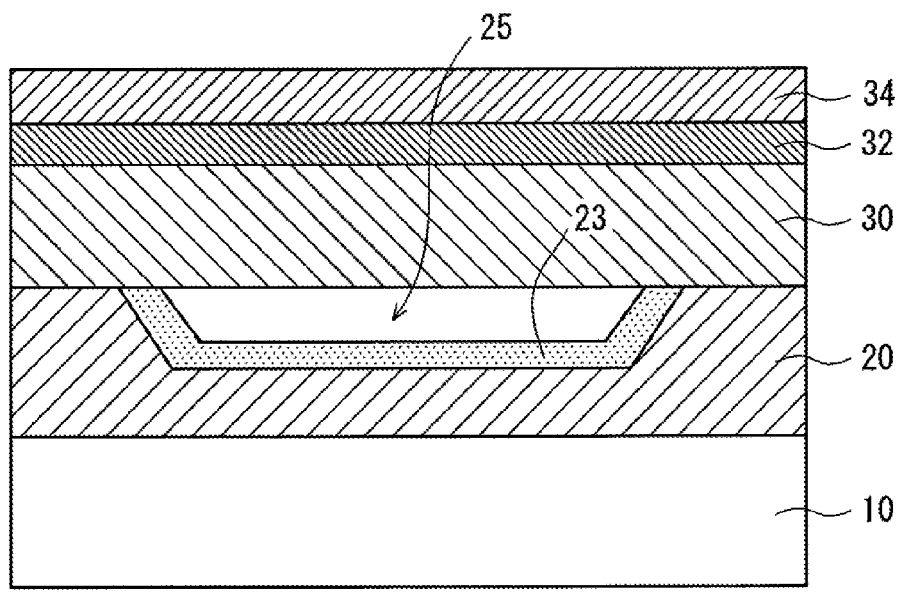

FIG.18
(a)
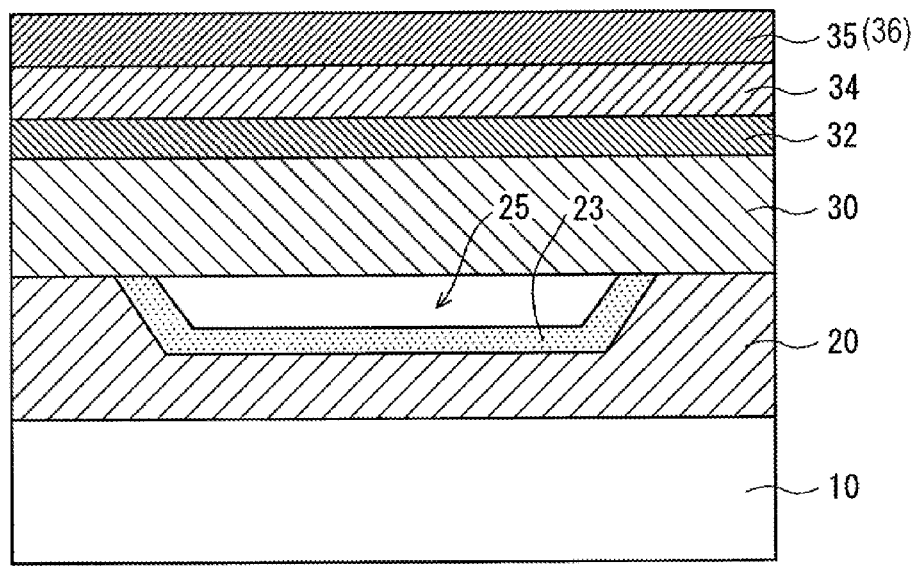
(b)
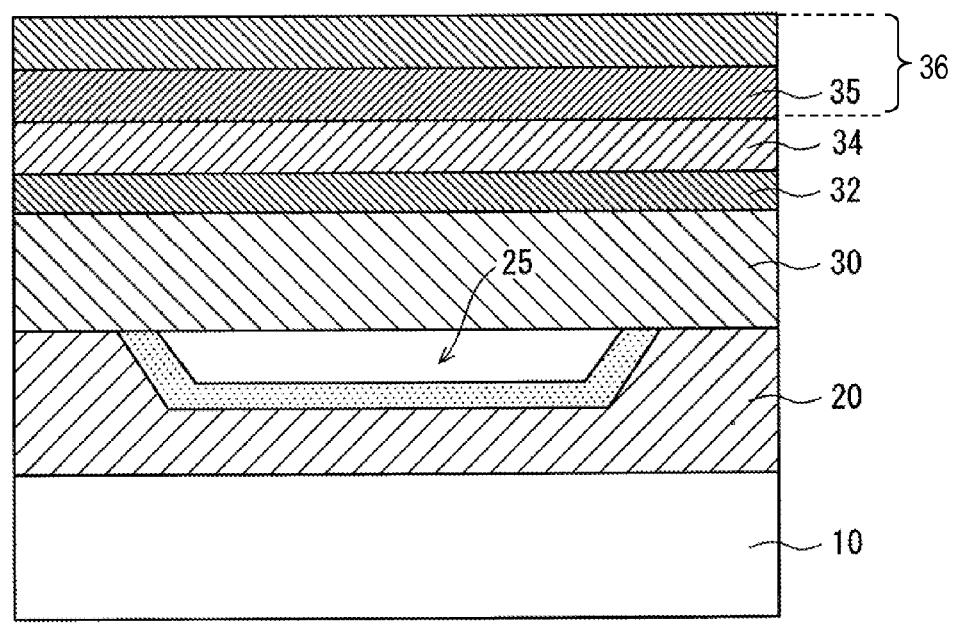

*FIG.20*
(a)
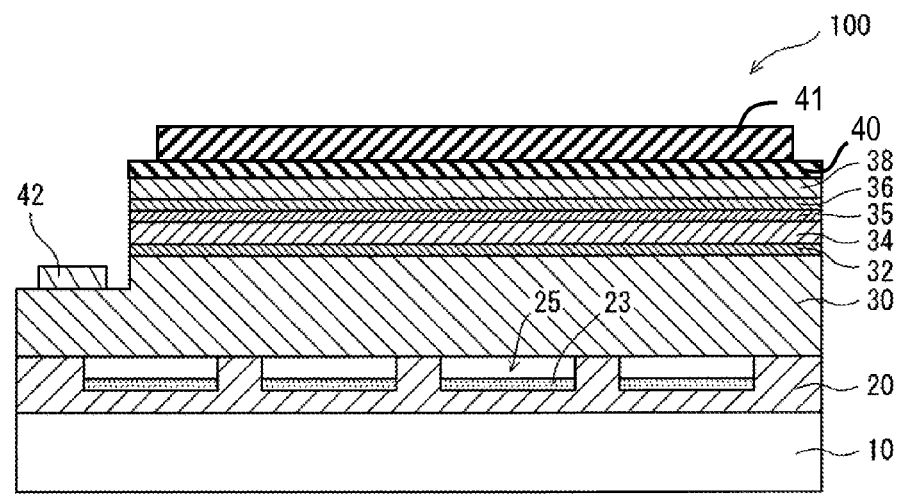
(b)
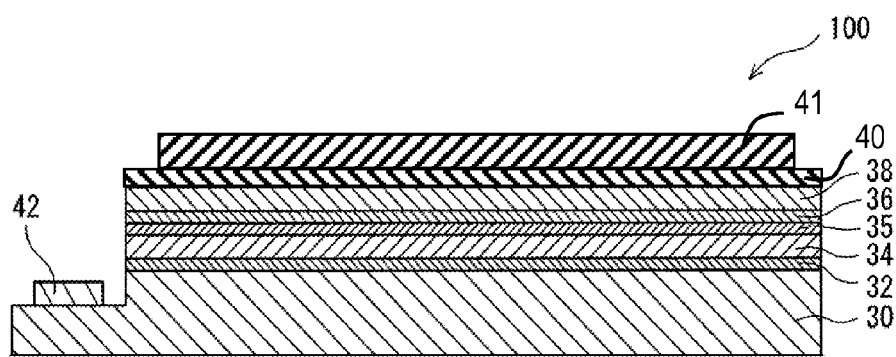

FIG.25

| CONCEN-TRATION OF IN ADDED (cm$^{-3}$) | NOT ADDED ($\leq 2\times 10^{16}$) | $3\times 10^{16}$ | $5\times 10^{16}$ | $7\times 10^{16}$ | $4\times 10^{17}$ | $8\times 10^{18}$ |
|---|---|---|---|---|---|---|
| EMISSION INTENSITY (arb. units) | 15 | 50 | 73 | 74 | 77 | 52 |

NITRIDE-BASED SEMICONDUCTOR LIGHT-EMITTING DEVICE AND METHOD FOR FABRICATING THE SAME

TECHNICAL FIELD

The present invention relates to a nitride-based semiconductor light-emitting device and a method for fabricating such a device. More particularly, the present invention relates to a GaN-based semiconductor light-emitting device such as a light-emitting diode or a laser diode that operates at wavelengths over the entire visible radiation range, which covers the ultraviolet, blue, green, orange and white parts of the spectrum, and that is expected to be applied to various fields of technologies including display, illumination and optical information processing in the near future.

BACKGROUND ART

A nitride semiconductor including nitrogen (N) as a Group V element is a prime candidate for a material to make a short-wave light-emitting device because its bandgap is sufficiently wide. Among other things, gallium nitride-based compound semiconductors (which will be referred to herein as "GaN-based semiconductors" and which are represented by the formula $Al_xGa_yIn_zN$ (where $0 \leq x, y, z \leq 1$ and $x+y+z=1$)) have been researched and developed particularly extensively. As a result, blue-ray-emitting light-emitting diodes (LEDs), green-ray-emitting LEDs and semiconductor laser diodes made of GaN-based semiconductors have already been used in actual products (see Patent Documents Nos. 1 and 2, for example).

When a semiconductor device is fabricated using GaN-based semiconductors, a sapphire wafer, an SiC wafer, an Si wafer or any other appropriate wafer is used as a wafer on which a crystal of GaN-based semiconductors needs to be grown. No matter which of these wafers is used, however, it is always difficult to achieve a sufficient degree of lattice matching between the wafer and the GaN-based semiconductor crystal (i.e., to realize a coherent growth). As a result, a lot of dislocations (including edge dislocations, spiral dislocations and mixed dislocations) will usually be produced inside the GaN-based semiconductor crystal and will have as high a density as approximately $1 \times 10^9$ $cm^{-2}$ when a sapphire wafer or an SiC wafer is used, for example. Consequently, an increase in threshold current and a decrease in reliability will be unavoidable as for a semiconductor laser diode, and an increase in power dissipation and a decrease in efficiency or reliability will be inevitable as for an LED. Also, some existent GaN wafers may certainly have a lower density of dislocations but its crystal would have a lot of residual strain. That is why even if a GaN-based semiconductor crystal is grown on such a wafer, it should be difficult to go without experiencing a similar problem.

Thus, a so-called "epitaxial lateral overgrowth (ELO)" technique has been proposed as a method for reducing the density of dislocations in a GaN-based semiconductor crystal. Such a method will effectively reduce the number of threading dislocations in a system with a high degree of lattice misfit. If a GaN-based semiconductor crystal is grown on each of the wafers described above by ELO, the upper part of the seed crystal will have a region in which there are a lot of dislocations at a density of approximately $1 \times 10^9$ $cm^{-2}$, but the density of locations can be reduced to around $1 \times 10^7$ $cm^{-2}$ in a laterally growing region. And if an active region, which is an electron injected region, is defined over such a region with a fewer number of dislocations, the reliability can be increased.

CITATION LIST

Patent Literature

Patent Document No. 1: Japanese Patent Application Laid-Open Publication No. 2001-308462
Patent Document No. 2: Japanese Patent Application Laid-Open Publication No. 2003-332697

SUMMARY OF INVENTION

Technical Problem

The present inventors, however, discovered that even such a GaN-based semiconductor light-emitting device, of which the crystal was grown by ELO, was not without a different kind of problem. Specifically, when a GaN-based semiconductor crystal, which had been grown by ELO, was analyzed with an X-ray micro beam, there was a non-uniform distribution of strain within a plane of the GaN-based semiconductor crystal. Such a non-uniform distribution of strain is not beneficial because it would make the emission intensity non-uniform within that plane.

It is therefore an object of the present invention to suppress the non-uniform strain in a nitride-based semiconductor light-emitting device, of which the crystal has been grown by ELO process.

Solution to Problem

A semiconductor device according to the present invention is a nitride-based semiconductor light-emitting device having a nitride-based semiconductor multilayer structure. The nitride-based semiconductor multilayer structure includes: an active layer including an $Al_aIn_bGa_cN$ crystal layer (where $a+b+c=1$, $a \geq 0$, $b \geq 0$ and $c \geq 0$); an $Al_dGa_eN$ overflow suppressing layer (where $d+e=1$, $d>0$, and $e \geq 0$); and an $Al_fGa_gN$ layer (where $f+g=1$, $f \geq 0$, $g \geq 0$ and $f<d$). The $Al_dGa_eN$ overflow suppressing layer is arranged between the active layer and the $Al_fGa_gN$ layer. And the $Al_dGa_eN$ overflow suppressing layer includes an In-doped layer that is doped with In at a concentration of $1 \times 10^{16}$ $atms/cm^3$ to $1 \times 10^{19}$ $atms/cm^3$.

In one preferred embodiment, the In-doped layer has an In concentration of $8 \times 10^{18}/cm^3$ or less.

In another preferred embodiment, the In-doped layer forms a part of the $Al_dGa_eN$ overflow suppressing layer and is arranged closest to the active layer.

In still another preferred embodiment, the In-doped layer is a half or less as thick as the $Al_dGa_eN$ overflow suppressing layer.

In yet another preferred embodiment, the nitride-based semiconductor light-emitting device further includes a selectively grown layer. The nitride-based semiconductor multilayer structure is arranged on the selectively grown layer. And the $Al_dGa_eN$ overflow suppressing layer is located on the other side of the active layer opposite to the selectively grown layer.

In yet another preferred embodiment, the nitride-based semiconductor multilayer structure has an m plane as its principal surface.

In another preferred embodiment, the selectively grown layer is an $Al_xGa_yIn_zN$ crystal layer (where $x+y+z=1$, $x \geq 0$, $y \geq 0$ and $z \geq 0$) that has grown from a surface region of an $Al_uGa_vIn_wN$ layer (where u+v+w=1, u≥0, v≥0 and w≥0), which is not covered with a mask layer.

In this particular preferred embodiment, the nitride-based semiconductor light-emitting device includes: a substrate; and the $Al_uGa_vIn_wN$ layer, which has been formed on the substrate and which is partially covered with the mask layer. The selectively grown layer is in contact with the surface region of the $Al_uGa_vIn_wN$ layer that is not covered with the mask layer.

In a specific preferred embodiment, another surface region of the $Al_uGa_vIn_wN$ layer that is covered with the mask layer defines a recess, and the selectively grown layer is out of contact with the mask layer.

In still another preferred embodiment, the selectively grown layer forms at least a part of a GaN substrate.

In yet another preferred embodiment, the more distant from the active layer, the lower the In concentration of the In-doped layer.

In yet another preferred embodiment, an undoped GaN layer is arranged between the active layer and the $Al_dGa_eN$ overflow suppressing layer.

A method according to the present invention is a method for fabricating a nitride-based semiconductor light-emitting device having a nitride-based semiconductor multilayer structure and includes the steps of: (a) forming an active layer including an $Al_aIn_bGa_cN$ crystal layer (where a+b+c=1, a≥0, b≥0 and c≥0) as a portion of the nitride-based semiconductor multilayer structure; (b) forming an $Al_dGa_eN$ overflow suppressing layer (where d+e=1, d>0, and e≥0) as another portion of the nitride-based semiconductor multilayer structure; and forming an $Al_fGa_gN$ layer (where f+g=1, f≥0, g≥0 and f<d) as still another portion of the nitride-based semiconductor multilayer structure. The step (b) includes forming an In-doped layer that is doped with In at a concentration of $1 \times 10^{16}$ atms/cm$^3$ to $1 \times 10^{19}$ atms/cm$^3$ in the $Al_dGa_eN$ overflow suppressing layer.

In one preferred embodiment, the In-doped layer has an In concentration of $8 \times 10^{18}$/cm$^3$ or less.

In another preferred embodiment, the In-doped layer forms a part of the $Al_dGa_eN$ overflow suppressing layer and is arranged closest to the active layer.

In still another preferred embodiment, the In-doped layer is a half or less as thick as the $Al_dGa_eN$ overflow suppressing layer.

In yet another preferred embodiment, the method further includes the step of forming a selectively grown layer, and the step (b) includes forming the $Al_dGa_eN$ overflow suppressing layer on the other side of the active layer opposite to the selectively grown layer.

In yet another preferred embodiment, the nitride-based semiconductor multilayer structure has an m plane as its principal surface.

In yet another preferred embodiment, the method further includes, before the step (a), the steps of: (c) forming an $Al_uGa_vIn_wN$ layer (where u+v+w=1, u≥0, v≥0 and w≥0) on a substrate; (d) forming a mask layer on a portion of the $Al_uGa_vIn_wN$ layer; and (e) supplying a source material to the $Al_uGa_vIn_wN$ layer with the mask layer, thereby growing an $Al_xGa_yIn_zN$ crystal layer (where x+y+z=1, x≥0, y≥0 and z≥0) to be the selectively grown layer using, as a seed crystal, another portion of the $Al_uGa_vIn_wN$ layer that is not covered with the mask layer. The step (e) includes forming the selectively grown layer that covers the mask layer by growing laterally at least a part of the $Al_xGa_yIn_zN$ crystal layer.

In this particular preferred embodiment, the step (d) includes cutting a recess through the $Al_uGa_vIn_wN$ layer and forming a mask layer at the bottom of the recess, and the step (e) includes growing the selectively grown layer over the mask layer with an air gap left between them.

In a specific preferred embodiment, the method further includes, after the step (b), the step of removing at least a part of the substrate.

In yet another preferred embodiment, the method further includes the steps of: providing a GaN substrate as the selectively grown layer; and forming an $Al_uGa_vIn_wN$ layer (where u+v+w=1, u≥0, v≥0 and w≥0), as a portion of the nitride-based semiconductor multilayer structure, on the GaN substrate.

Advantageous Effects of Invention

According to the present invention, a layer including In at a concentration of $1 \times 10^{16}$ atms/cm$^3$ to $1 \times 10^{19}$ atms/cm$^3$ is formed in an $Al_dGa_eN$ layer, thereby minimizing the occurrence of non-uniform strain in a nitride-based semiconductor light-emitting device. As a result, it is possible to prevent the nitride-based semiconductor light-emitting device from having a non-uniform in-plane distribution of emission.

BRIEF DESCRIPTION OF DRAWINGS

FIG. 2(a) is a cross-sectional view schematically illustrating a second specific preferred embodiment of the present invention, and FIG. 2(b) is a graph showing the atomic concentrations of the active layer 32, the undoped GaN layer 34 and the $Al_dGa_eN$ layer 36 of the second preferred embodiment vary in the depth direction.

FIG. 3(a) is a graph showing how the degrees of internal quantum efficiency and internal loss change according to the thickness of an overflow suppressing layer (i.e., $Al_dGa_eN$ layer) 36, and FIG. 3(b) is a graph showing how the degree of internal loss changes with the distance between the $Al_dGa_eN$ layer 36 and the active layer 32 (i.e., the thickness of the undoped GaN layer 34).

Figure 4:
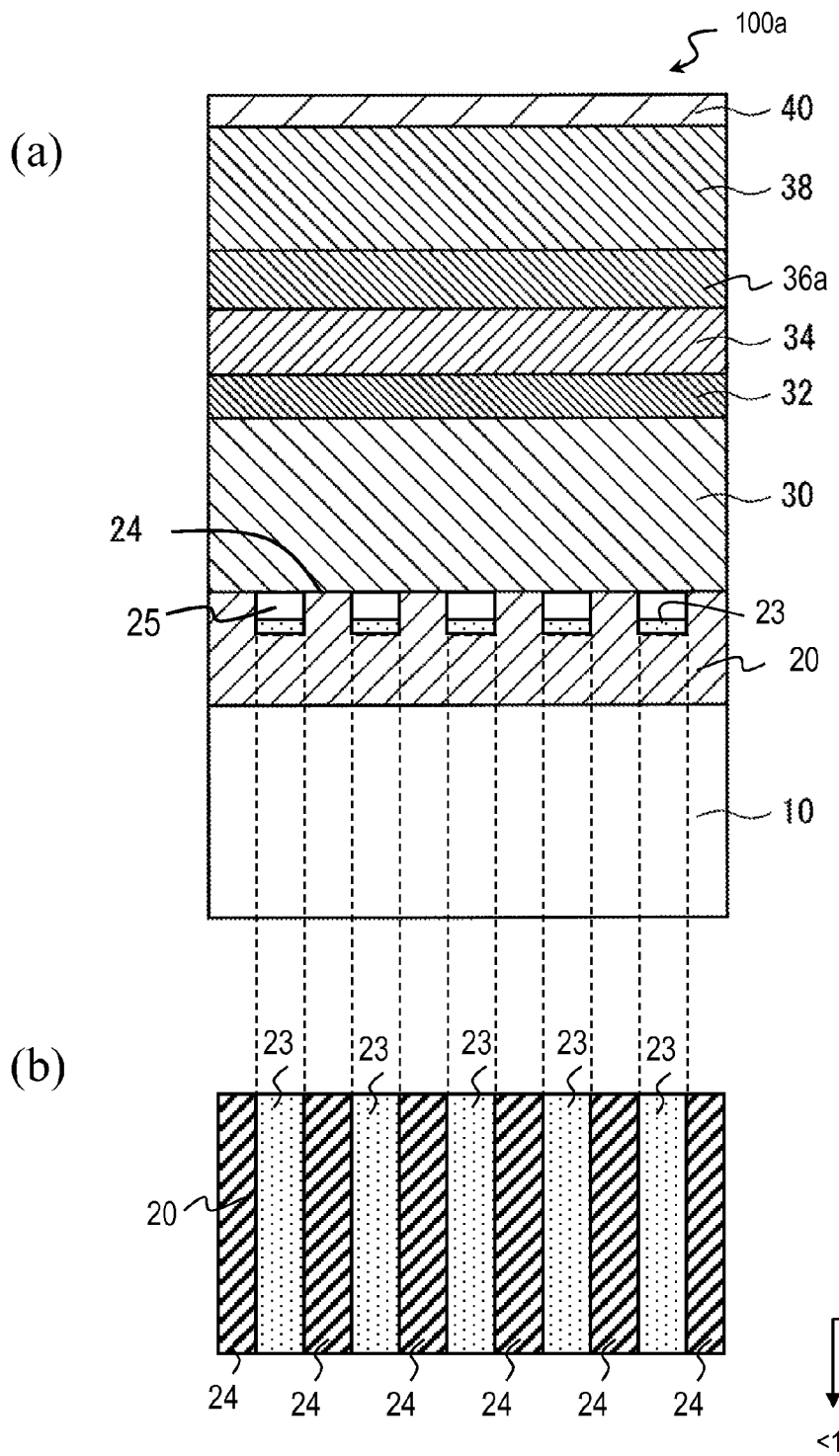

Portions (a) and (b) of FIG. 4 are respectively a cross-sectional view and a top view illustrating the structure of a sample 100a that was used to carry out a rocking curve measurement.

FIGS. 5(a) and 5(b) show the results of a rocking curve measurement that was carried out on a nitride-based semiconductor light-emitting device, of which the $Al_dGa_eN$ layer 36 had no In-doped layer 35.

FIGS. 6(a) and 6(b) are photographs showing results of evaluation that was carried out, using cathode luminescence, on a structure including a GaN layer instead of the In-doped layer 35 and on a structure including an InGaN layer instead of the In-doped layer 35, respectively.

Figure 7:

FIG. 7 is a photograph showing a result of evaluation that was carried out, using cathode luminescence, on the second preferred embodiment of the present invention.

Figure 8:
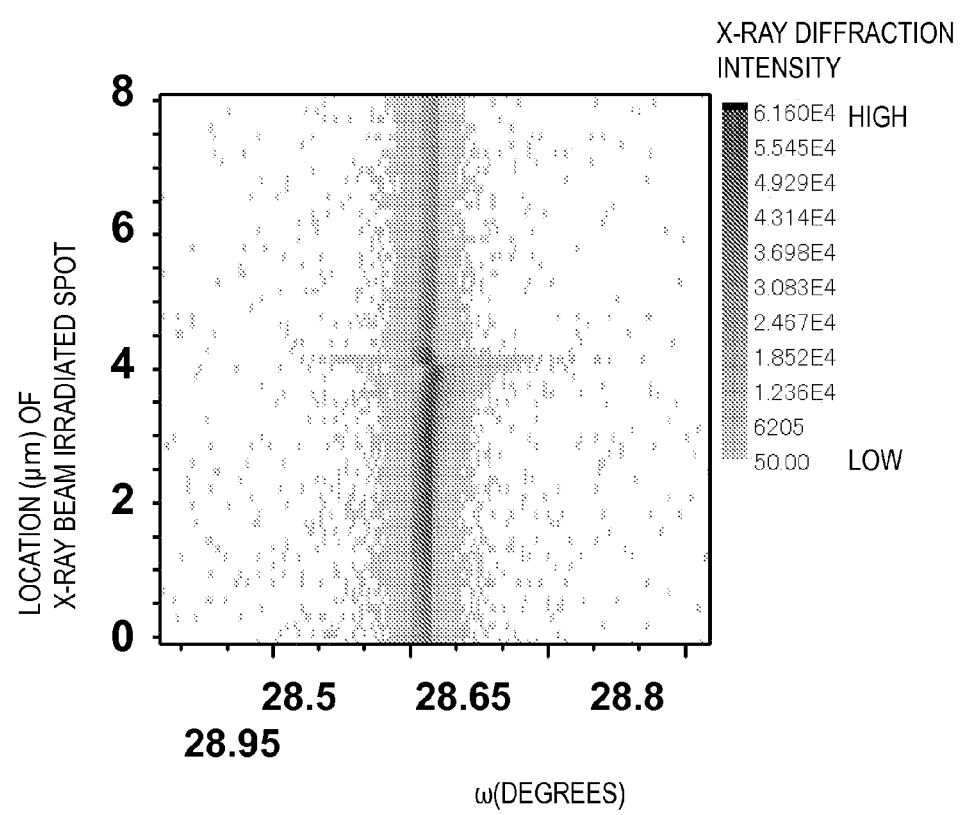

FIG. 8 shows a result of a rocking curve measurement that was carried out on the second preferred embodiment of the present invention.

Portion (a) of FIG. 9 illustrates the surface of a semiconductor layer with tensile strain regions 80 and compressive strain regions 81, and portions (b) and (c) of FIG. 9 illustrate exactly how a non-uniform strain distribution is produced within a plane of the semiconductor layer and how that non-uniform strain distribution can be smoothed out within the plane of the semiconductor layer, respectively.

Figure 10:
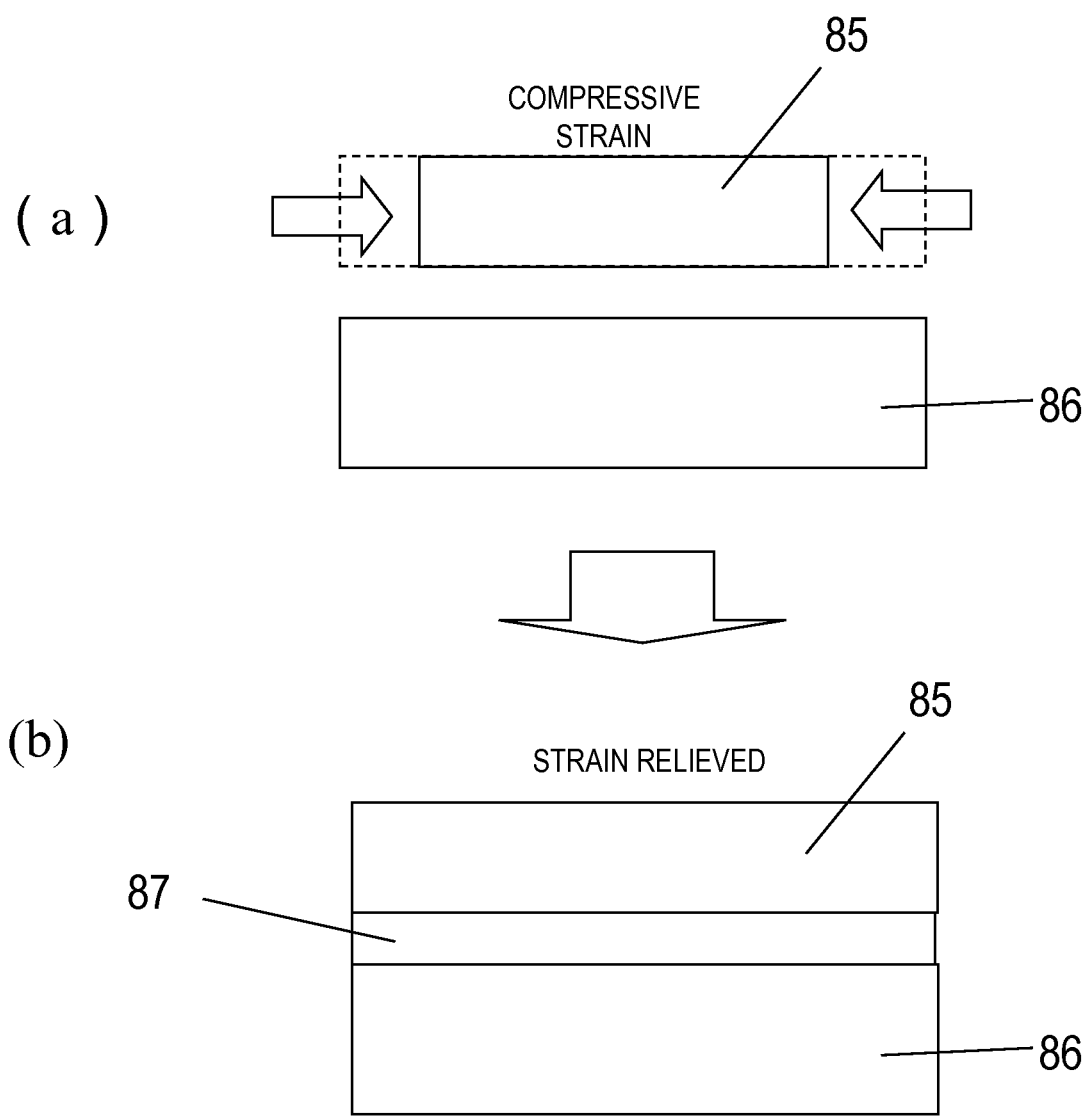

Portions (a) and (b) of FIG. 10 illustrate a conventional approach to the strain problem.

Portions (a) and (b) of FIG. 11 illustrate the approach adopted in a preferred embodiment of the present invention to overcome the strain problem.

Figure 12:
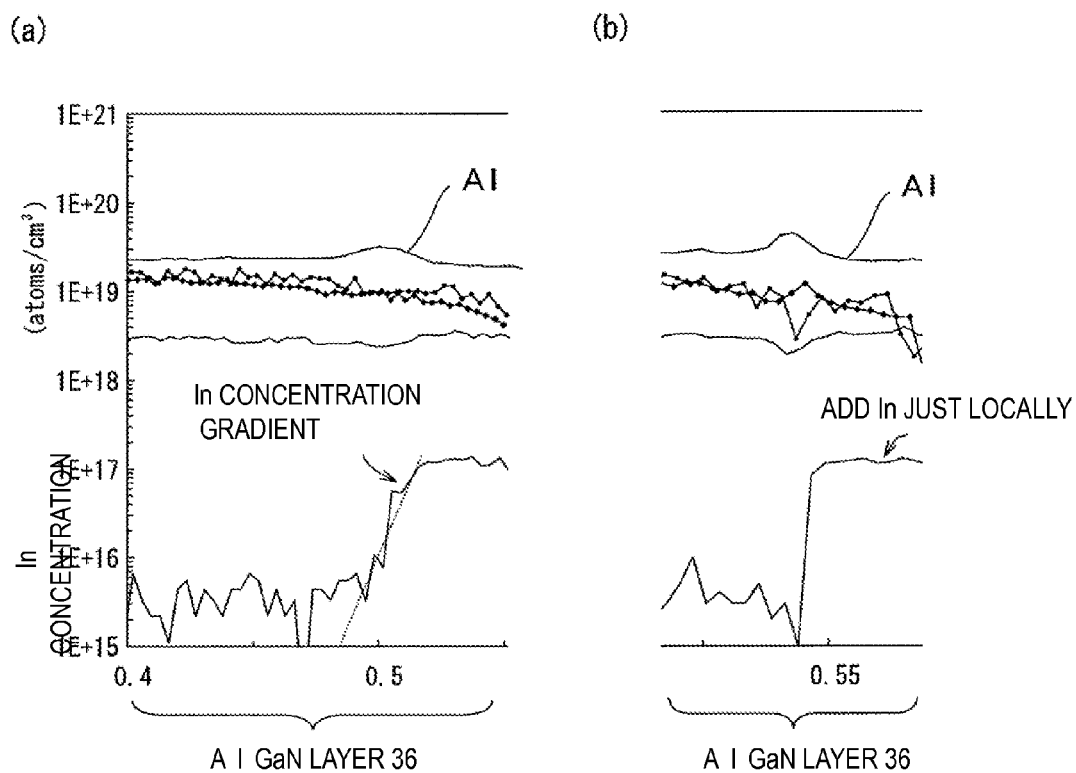

Portions (a) and (b) of FIG. 12 show the concentrations of In that had been introduced into the $Al_dGa_eN$ layer 36 (i.e., the In concentration in the In-doped layer 35) and that was measured by SIMS (secondary ion mass spectrometry).

Figure 13:
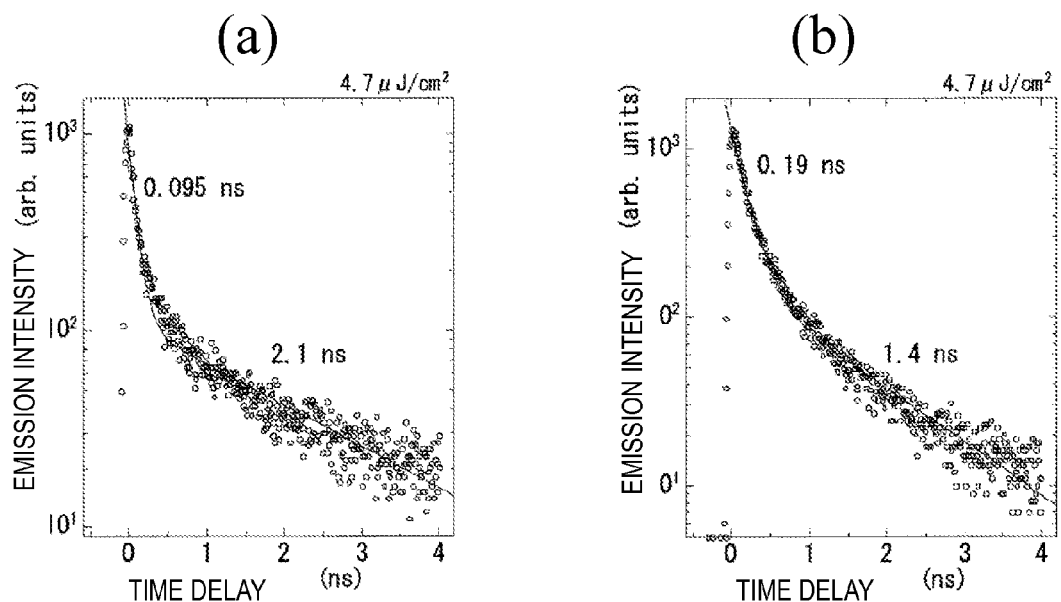

FIGS. 13(a) and 13(b) are graphs showing how the emission intensity (in arbitrary unit) changed with the time delay (ns) in a comparative example and in the second preferred embodiment of the present invention, respectively.

FIG. 14 is a table that summarizes luminous efficacy values measured.

FIGS. 15(a) to 15(c) are cross-sectional views illustrating respective manufacturing process steps according to the second preferred embodiment of the present invention.

FIGS. 16(a) and 16(b) are cross-sectional views illustrating respective manufacturing process steps according to the second preferred embodiment of the present invention.

FIGS. 17(a) and 17(b) are cross-sectional views illustrating respective manufacturing process steps according to the second preferred embodiment of the present invention.

FIGS. 18(a) and 18(b) are cross-sectional views illustrating respective manufacturing process steps according to the second preferred embodiment of the present invention.

Figure 19:
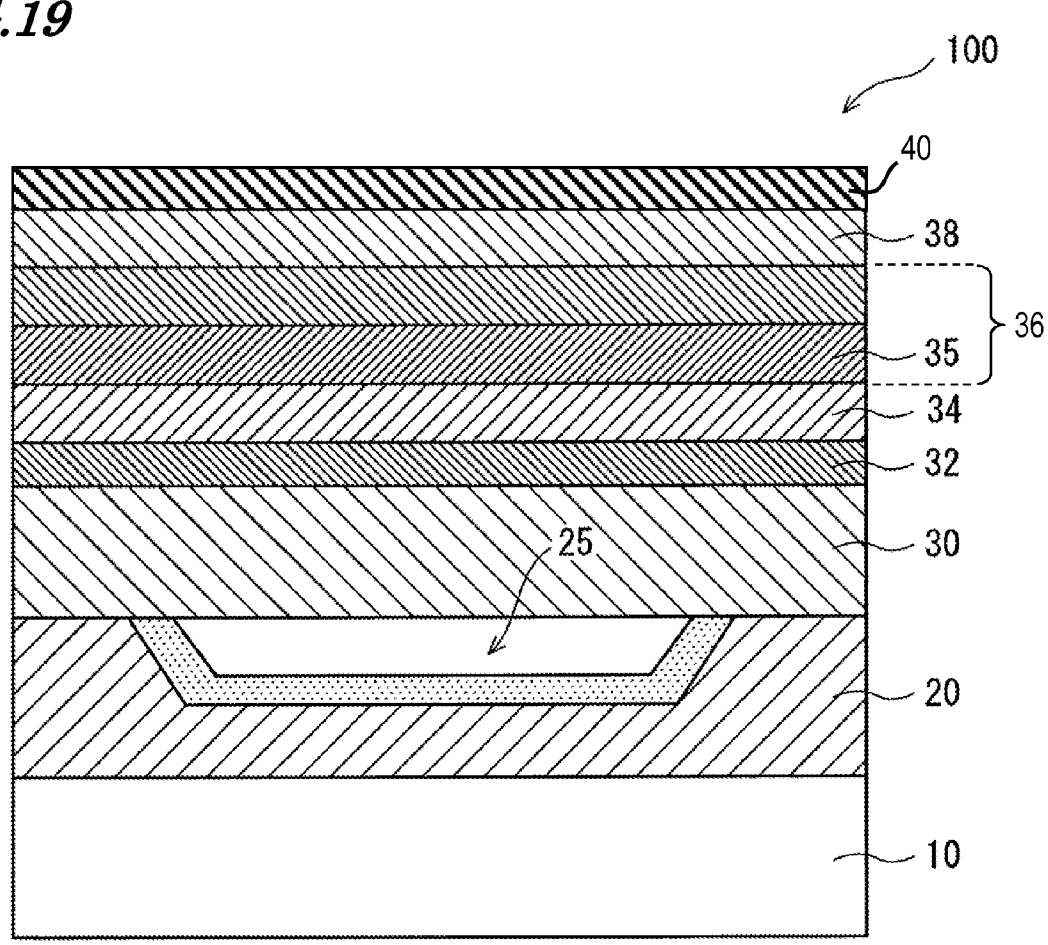

FIG. 19 is a cross-sectional view illustrating a manufacturing process step according to the second preferred embodiment of the present invention.

FIGS. 20(a) and 20(b) are cross-sectional views illustrating respective manufacturing process steps according to the second preferred embodiment of the present invention.

Figure 21:
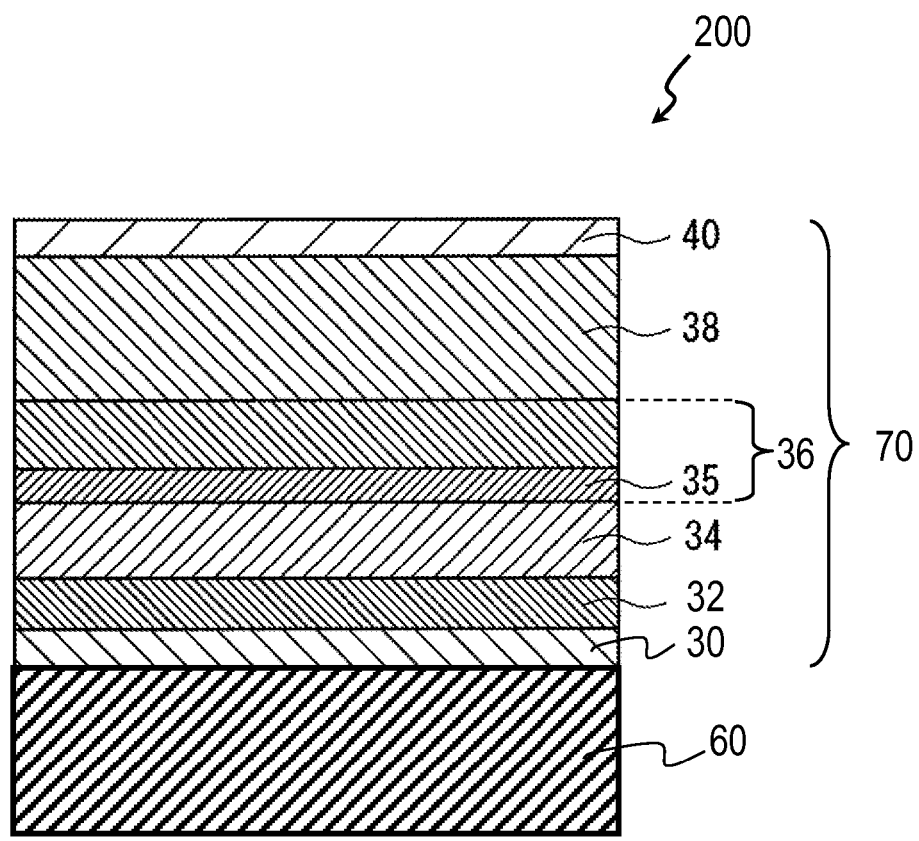

FIG. 21 is a cross-sectional view schematically illustrating a third preferred embodiment of the present invention.

Figure 22:
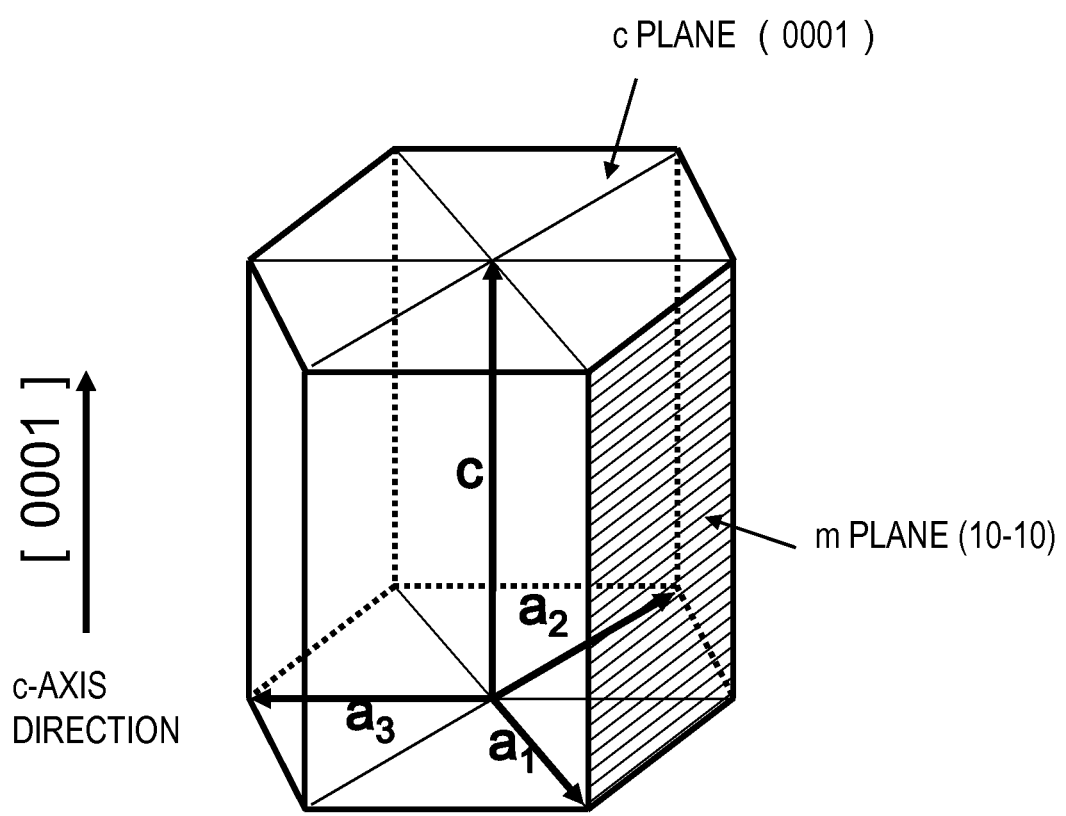

FIG. 22 is a perspective view showing the fundamental vectors a1, a2, a3 and c of a wurtzite crystal structure.

Figure 23:
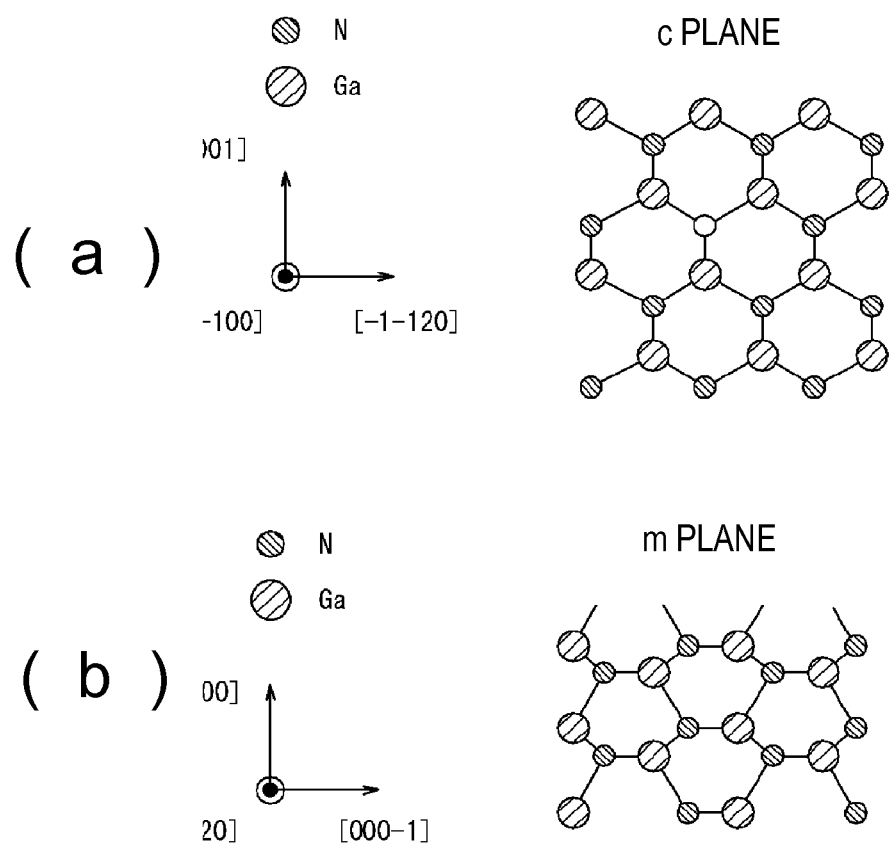

FIGS. 23(a) and 23(b) schematically illustrate the crystal structures of nitride-based semiconductors, of which the principal surfaces are a c plane and an m plane, respectively, as viewed on a cross section thereof that intersects with the principal surface of the substrate at right angles.

Figure 24:
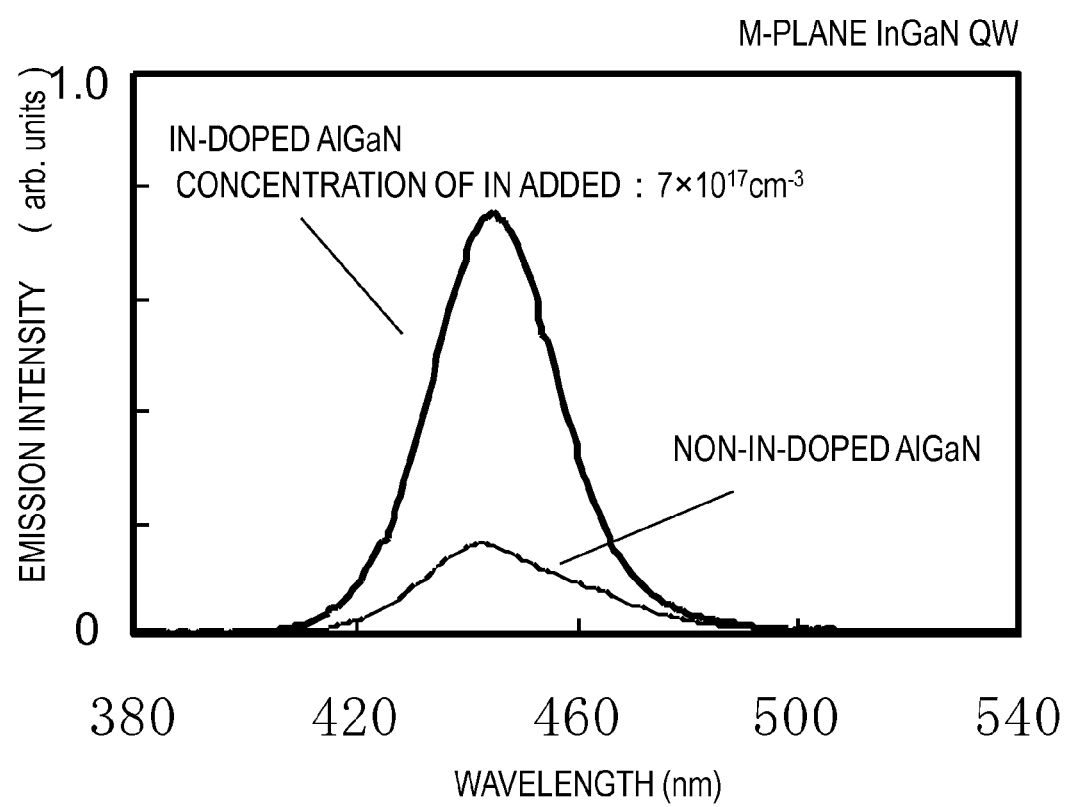

FIG. 24 is a graph showing the emission spectrum of an m-plane $Al_dGa_eN$ layer (i.e., the overflow suppressing layer), to which In was added, at room temperature.

FIG. 25 is a table that summarizes relations between the concentration of In added to the m-plane $Al_dGa_eN$ layer (i.e., the overflow suppressing layer) and the emission intensity at room temperature.

DESCRIPTION OF EMBODIMENTS

Embodiment 1

Hereinafter, a first specific preferred embodiment of a nitride-based semiconductor light-emitting device according to the present invention will be described with reference to FIG. 1.

Figure 1:
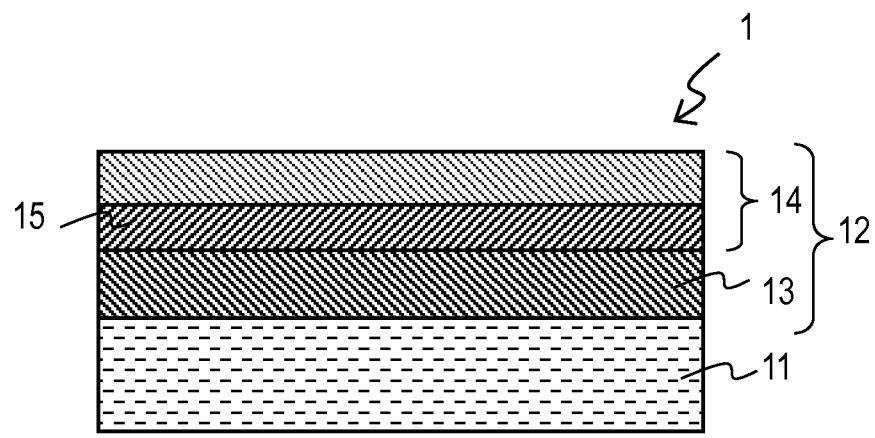
FIG. 1 is a cross-sectional view schematically illustrating a first specific preferred embodiment of the present invention.

As shown in FIG. 1, the nitride-based semiconductor light-emitting device 1 of this preferred embodiment includes a selectively grown layer 11 and a nitride-based semiconductor multilayer structure 12 that has been formed on the selectively grown layer 11, which has a portion that has been grown laterally by ELO process.

The nitride-based semiconductor multilayer structure 12 includes an active layer 13 including an $Al_aIn_bGa_cN$ crystal layer (where $a+b+c=1$, $a\geq 0$, $b\geq 0$ and $c\geq 0$) and an $Al_dGa_eN$ layer 14 (where $d+e=1$, $d>0$, and $e\geq 0$), which is located on the other side of the active layer 13 opposite to the selectively grown layer 11.

The $Al_dGa_eN$ layer 14 includes a layer 15 that includes In at a concentration of $1\times 10^{16}$ atms/cm$^3$ to $1\times 10^{19}$ atms/cm$^3$ (which will be simply referred to herein as an "In-doped layer").

A GaN-based semiconductor crystal including In as one of its constituent elements (or parent elements) is already known. In general, if In is supposed to be one of the constituent elements of a crystal, then In should be included in a concentration that is high enough to have some impact on the physical properties of a GaN-based semiconductor crystal. If the In concentration was $1\times 10^{19}$ cm$^{-3}$, for example, In would account for just 1% of the entire composition. In that case, the physical property would be almost no different from a situation where no In is included. That is why if In is supposed to be one of such essential constituent elements of a crystal, then the In concentration should be higher than $1\times 10^{19}$ cm$^{-3}$ (e.g., $1\times 10^{20}$ cm$^{-3}$ or more). That is to say, the In concentration of the In-doped layer 15 of this preferred embodiment is lower than the one in a situation where In is one of the essential elements of a crystal.

The present inventors discovered that there was a non-uniform distribution of strain within a plane of a GaN-based semiconductor crystal that had been grown by ELO process. According to this preferred embodiment, such a non-uniform distribution of strain can be smoothed out by forming the In-doped layer 15 as a part of the $Al_dGa_eN$ layer 14. It is not quite clear at this time exactly how and why it works. But we find it proper to reason that if In atoms, which are bigger in size than Al or Ga atoms, are included in a concentration that is merely as high as that of a normal dopant, a moderate degree of strain should be caused and would probably contribute to smoothing out that non-uniform distribution. As for a GaN-based semiconductor crystal including In as one of its essential constituent elements, on the other hand, In should account for such a high percentage of the entire composition that the lattice constant would increase so much as to produce excessive strain inside the crystal.

In FIG. 1, the active layer 13 is in contact with the selectively grown layer 11. However, some layer may be inserted between the active layer 13 and the selectively grown layer 11. Likewise, some layer may be interposed between the active layer 13 and the $Al_dGa_eN$ layer 14.

The selectively grown layer 11 may be either an $Al_xGa_yIn_zN$ crystal layer (where $x+y+z=1$) that has been formed on a substrate or a part of a GaN substrate. Those structures and their manufacturing methods will be described as second and third specific preferred embodiments of the present invention.

Embodiment 2

Hereinafter, a second specific preferred embodiment of a nitride-based semiconductor light-emitting device according to the present invention will be described with reference to FIGS. 2 through 20. The nitride-based semiconductor light-emitting device 100 of this preferred embodiment is a semiconductor device made of GaN-based semiconductors and has been fabricated by ELO process to reduce its density of dislocations.

As shown in FIG. 2(a), the light-emitting device 100 of this preferred embodiment includes a substrate 10, an $Al_uGa_vIn_wN$ layer 20 (where $u+v+w=1$, $u\geq 0$, $v\geq 0$ and $w\geq 0$) that has been formed on the substrate 10, an $Al_xGa_yIn_zN$ crystal layer 30 (where $x+y+z=1$, $x\geq 0$, $y\geq 0$ and $z\geq 0$) that has been grown on the $Al_uGa_vIn_wN$ layer 20 and functions as a selectively grown layer, and a semiconductor multilayer structure 50 arranged on the $Al_xGa_yIn_zN$ crystal layer 30.

A recess 22 has been cut through the $Al_uGa_vIn_wN$ layer 20 and a selective growth mask 23 is arranged at the bottom of the recess 22. The selective growth mask 23 is made of a dielectric film, an amorphous insulating film or a metal film.

As the thickness of the selective growth mask 23 is less than the depth of the recess 22, there is an air gap 25, which is surrounded with the side surfaces of the recess 22 and the lower surface of the $Al_xGa_yIn_zN$ crystal layer 30 and which is located over the mask 23.

The $Al_xGa_yIn_zN$ crystal layer 30 includes a dopant of a first conductivity type (which may be n-type, for example) and has grown using, as its seed crystal, at least a part of a surface region of the $Al_uGa_vIn_wN$ layer 20 that is not covered with the selective growth mask 23 (such a surface region will be referred to herein as a "seed crystal region 24"). And a portion of the $Al_xGa_yIn_zN$ crystal layer 30 that is located over the air gap 25 has grown laterally.

If the air gap 25 is left, then the selective growth mask 23 does not contact with the laterally grown portion of the $Al_xGa_yIn_zN$ crystal layer 30. As a result, the interfacial stress can be minimized and that laterally grown portion of the $Al_xGa_yIn_zN$ crystal layer 30 comes to have a crystal axis with a decreased tilt angle. Consequently, an $Al_xGa_yIn_zN$ crystal layer 30 with a sufficiently low density of dislocations can be obtained in a broad area (i.e., the laterally grown region) of the $Al_uGa_vIn_wN$ layer 20 except for its seed crystal region that is in contact with the $Al_xGa_yIn_zN$ crystal layer 30.

In the semiconductor multilayer structure 50, there is an active layer 32, including an $Al_aIn_bGa_cN$ crystal layer (where a+b+c=1, a≥0, b≥0 and c≥0), over the $Al_xGa_yIn_zN$ crystal layer 30. In this case, the active layer 32 is an electron injected region of the nitride-based semiconductor light-emitting device 100. On the active layer 32, arranged is an $Al_dGa_eN$ layer 36 (where d+e=1, d>0, and e≥0) of a second conductivity type (e.g., p-type). In this preferred embodiment, the $Al_dGa_eN$ layer 36 is doped with Mg. In a GaN-based material, electrons have a small effective mass. That is why if the amount of drive current is increased in an LED or a laser structure that uses GaN-based materials, a greater number of electrons will overflow and the efficiently will decrease. Thus, to minimize such an overflow, the $Al_dGa_eN$ layer 36 is provided as an overflow suppressing layer on one side of the active layer 32 closer to p-type layers. The $Al_dGa_eN$ layer 36 preferably has a thickness of 10 nm to 200 nm.

An undoped GaN layer 34 is sandwiched between the active layer 32 and the $Al_dGa_eN$ layer 36.

An In-doped layer 35 forms a lower part of the $Al_dGa_eN$ layer 36. Considering that the closer to the active layer 32 the In-doped layer 35 is, the more perfectly the non-uniform distribution of strain in the active layer 32 can be smoothed out, the In-doped layer 35 preferably forms a lower part of the $Al_dGa_eN$ layer 36 (i.e., closest to the active layer 32). The In-doped layer 35 preferably has a thickness of 10 nm to 100 nm.

On the $Al_dGa_eN$ layer 36 including the In-doped layer 35, arranged is a GaN layer 38 of the second conductivity type (e.g., p-type). The GaN layer 38 functions as an electricity guide layer for guiding holes from a p-electrode to the active layer. The GaN layer 38 does not have to be made of GaN only but could be made of an $Al_fGa_gN$ layer (where f+g=1, f≥0, and g≥0). Nevertheless, the Al mole fraction of the $Al_fGa_gN$ layer should be lower than that of the $Al_dGa_eN$ layer (the overflow suppressing layer) 36 (i.e., f<d should be satisfied). The $Al_dGa_eN$ layer (overflow suppressing layer) 36 is arranged between the active layer 32 and the GaN layer 38.

And on the GaN layer 38, arranged is a contact layer 40 of $p^+$-GaN.

FIG. 2(b) shows how the atomic concentration varies in a region of the light-emitting device 100 of this preferred embodiment that covers the range from the active layer 32 through the $Al_dGa_eN$ layer 36. In FIG. 2(b), the ordinate represents the atomic concentration as a logarithm, while the abscissa represents a point of measurement in the depth direction. Specifically, in FIG. 2(b), the region where there is Al corresponds to the $Al_dGa_eN$ layer 36, the region where there is neither Al nor In corresponds to the undoped GaN layer 34, and the region where there is only In corresponds to the active layer 32. The Al concentration in the active layer 32 is substantially zero.

And a portion of the $Al_dGa_eN$ layer 36 including In at a concentration of $1\times10^{16}$ atoms/cm$^3$ to $1\times10^{19}$ atoms/cm$^3$ corresponds to the In-doped layer 35. In the $Al_dGa_eN$ layer 36 of this preferred embodiment, the In concentration in the In-doped layer 35 decreases toward the upper surface of the $Al_dGa_eN$ layer 36 (i.e., in the positive x-axis direction).

The $Al_dGa_eN$ layer (overflow suppressing layer) 36 has so high an Al mole fraction of nearly 20% as to have a greater bandgap than any other semiconductor layer that is in contact with the $Al_dGa_eN$ layer 36. As a result, strain is produced between the $Al_dGa_eN$ layer 36 and other semiconductor layers that are in contact with the $Al_dGa_eN$ layer 36 and affects the active layer 32. FIG. 3(a) shows how the internal quantum efficiency and internal loss change with the thickness of the overflow suppressing layer (i.e., the $Al_dGa_eN$ layer 36). In FIG. 3(a), the solid line graph indicates the internal quantum efficiency, while the dotted line graph indicates the internal loss. As can be seen from FIG. 3(a), the greater the thickness, the higher the internal quantum efficiency. This is probably because the thicker the overflow suppressing layer, the more effectively the overflow of electrons can be suppressed. Nonetheless, as the overflow suppressing layer grows thicker, the internal loss increases, too. This should be because the thicker the overflow suppressing layer, the greater the degree of strain produced. These results reveal that the thicker the overflow suppressing layer, the more effectively the overflow of electrons can be suppressed and the higher the internal quantum efficiency but the more significant the internal loss, too, due to the influence of strain.

The distance between the $Al_dGa_eN$ layer 36 and the active layer 32 can be changed by adjusting the thickness of the undoped GaN layer 34. FIG. 3(b) shows how the degree of internal loss changes with the distance between the $Al_dGa_eN$ layer 36 and the active layer 32 (i.e., the thickness of the undoped GaN layer 34). It can be seen that if the distance between the $Al_dGa_eN$ layer 36 and the active layer 32 is shortened by reducing the thickness of the undoped GaN layer 34, the internal loss increases. Such a result would mean that the shorter the distance between the $Al_dGa_eN$ layer 36 and the active layer 32, the greater the influence of the strain on the active layer 32.

These results reveal that to minimize the overflow, the $Al_dGa_eN$ layer 36 preferably has an increased thickness and that to reduce the influence of the strain on the active layer 32, the undoped GaN layer 34 is preferably provided.

Next, the non-uniform distribution of strain that was newly discovered by the present inventors (i.e., the non-uniform distribution of strain within a plane of a GaN based semiconductor crystal) will be described with reference to FIGS. 4 through 7.

The present inventors evaluated a nitride-based semiconductor light-emitting device with no In-doped layer 35 by carrying out a rocking curve measurement using X-ray micro beams in SPring8 (Super Photon ring-8 GeV).

SPring8 is a huge synchrotron radiation facility, which is located in Harima Science Park City, Hyogo, JAPAN. In that facility, a group of accelerators for accelerating and storing electrons and radiation beams generated can be used. On the other hand, the "rocking curve measurement" (which is also called "θ scan method") is a method for estimating a variation in X-ray intensity at a peak of diffraction by scanning a sample for a very small angular ω range with the Bragg diffraction angle 2θ fixed at a (0002) diffraction peak position.

The structure of the sample (nitride-based semiconductor light-emitting device) that was used in that measurement is shown in portions (a) and (b) of FIG. 4. As can be seen from portion (a) of FIG. 4, the sample 100a for measurement has a structure in which an active layer 32, an undoped GaN layer 34, an $Al_dGa_eN$ layer 36a with no In-doped layer, a GaN layer 38 and a contact layer 40 are stacked in this order on an $Al_xGa_yIn_zN$ crystal layer 30. The $Al_xGa_yIn_zN$ crystal layer 30 of the sample 100a has been formed by re-crystallizing seed crystal regions 24 as seed crystals. As shown in portions (a) and (b) of FIG. 4, in this sample 100a, there are a number of selective growth masks 23 that cover the surface of the $Al_uGa_vIn_wN$ layer 20 and a number of seed crystal regions 24, all of which run in stripes in <1-100> directions.

First of all, X-ray micro beams, which had been condensed to the order of sub-micrometers, were generated by using a zone plate and slits in combination and then made to be incident on the sample 100a. Then, the sample was scanned for a very small angular ω range with the Bragg diffraction angle 2θ fixed at the angle ω at which a (0002) diffraction peak appeared, thereby measuring the X-ray diffraction intensities. Specifically, with the Bragg diffraction angle 2θ fixed at around 28.8 degrees, the angle ω of the sample was changed from 28.5 degrees into 29.15 degrees, thereby measuring X-ray diffraction intensities at respective angles ω. Thereafter, similar measurements were repeatedly carried out a number of times with points of measurement on the sample 100a changed in a step of 0.5 μm in <11-20> directions.

FIGS. 5(a) and 5(b) show results of the measurements. In FIGS. 5(a) and 5(b), the ordinate represents the distance as measured in the <11-20> directions from a point where the measurement was started on the sample 100a. The measurement start points were changed every time the measurement was started. On the other hand, the abscissa represents the angle defined by the sample 100a with respect to the X-ray incoming direction. In FIGS. 5(a) and 5(b), the higher the diffraction intensity of a given region is, the darker the color of that region (i.e., the closer to solid black its color grey is). Specifically, FIG. 5(a) illustrates a two-dimensional map that was obtained by making X-ray micro beams incident on the sample 100a from <1-100> directions. On the other hand, FIG. 5(b) illustrates a two-dimensional map that was obtained by making X-ray micro beams incident on the sample 100a from the <11-20> directions.

In FIGS. 5(a) and 5(b), the presence of those portions with the seed crystal regions 24 and the air gap 25 (i.e., the regions with the selective growth masks 23) was confirmed periodically. In each of those seed crystal regions 24, the grey area laterally spreads more broadly than the region with the air gap 25 and a high diffraction intensity was maintained even if the angle ω of the sample was changed. These results reveal that the full width at half maximum of the rocking curve increased significantly in the seed crystal regions 24 probably because of a high density of dislocations and the stress applied by the substrate.

Among other things, close attention should be paid to the fact that a region d with low lightness appeared at a ω of approximately 28.65 degrees at an ordinate of 60 μm but at a ω of approximately 28.9 degrees at an ordinate of 80 μm as shown in FIG. 5(a). In this manner, a region with low lightness appeared in a different angular ω position (i.e., shifted) according to the point of measurement (i.e., the ordinate) on the sample 100a. Thus, it can be seen that the X-ray diffraction peak angle of the rocking curve varied significantly according to the point of measurement on the sample 100a. These results reveal that there was a non-uniform distribution of strain in the semiconductor multilayer structure over the air gap 25.

FIGS. 6(a) and 6(b) are photographs showing results of evaluation that was carried out on semiconductor multilayer structures using cathode luminescence. Specifically, FIG. 6(a) shows a result of evaluation that was carried out on a structure including a GaN layer instead of the In-doped layer 35 of the semiconductor multilayer structure 100 shown in FIG. 2(a). On the other hand, FIG. 6(b) shows a result of evaluation that was carried out on a structure including an InGaN layer instead of the In-doped layer 35 of the semiconductor multilayer structure 100. It should be noted that those evaluations were carried out on the semiconductor multilayer structure 100 in which every layer but the contact layer 40 had already been formed. The emission wavelength for evaluation was 400 nm.

As can be seen from FIGS. 6(a) and 6(b), some unevenness in emission intensity was observed, and therefore, there would have been non-uniform distribution of strain within a plane of a GaN-based semiconductor crystal that had been grown by ELO process. In other words, the present inventors discovered that even the ELO process, which can be normally used effectively as a method for reducing threading dislocations in a GaN-based semiconductor crystal, also had a different kind of problem. It is not quite clear at this stage exactly how and why such non-uniform distribution of strain was produced. But such a non-uniform strain distribution would probably have been caused due to strong compressive strain to be produced when laterally grown crystals combined with each other. To avoid the occurrence of such a non-uniform strain distribution, the GaN-based semiconductor crystal needs to be grown without adopting the ELO process. In that case, however, the number of threading dislocations cannot be reduced in turn.

If the arrangement of multiple layers in the GaN-based light-emitting device 100 were significantly changed from a typical one, then some conditions for avoiding such non-uniform strain distribution even when the ELO process is adopted could be found. In that case, however, the arrangement of layers should be changed so significantly that it might be difficult for the GaN-based semiconductor light-emitting device to exhibit desired properties or its life or reliability might have to be sacrificed.

With these considerations in mind, the present inventors discovered that the occurrence of such a non-uniform strain distribution could be avoided by providing the In-doped layer 35 intentionally for the $Al_dGa_eN$ layer 36 as shown in FIG. 2(a). FIG. 7 is a photograph showing a result of the evaluation that was carried out on the structure shown in FIG. 2(a) with cathode luminescence.

In the photograph shown in FIG. 7, although there is some disturbed image portion on the left-hand side, such a portion just represents an error in image processing, not strain. As can be seen from the right hand side portion of the photograph shown in FIG. 7, the arrangement of this preferred embodiment including the In-doped layer 35 had a lesser degree of unevenness in emission intensity than the situation shown in FIG. 6(a) or 6(b). These results reveal that the non-uniform strain distribution as seen in the examples shown in FIGS. 6(a) and 6(b) could be avoided according to this preferred embodiment.

FIG. 8 shows a result of the rocking curve measurement that was carried out on the nitride-based semiconductor light-emitting device 100 of this preferred embodiment. In FIG. 8, a two-dimensional map obtained by making X-ray micro beams incident on the sample from the <11-20> directions is also shown as in FIG. 5(a).

In FIG. 8, scales on the axis of ordinates read 0.5 μm, which is smaller than one scale of 5 μm in FIGS. 5(a) and 5(b). That is why the non-uniformity of the distribution should have been magnified in FIG. 8 compared to FIG. 5. Actually, however, the grey area in FIG. 8 has a substantially constant width irrespective of a point of measurement on the sample (as represented by the ordinate), and therefore, the rocking curve has a substantially constant full width at half maximum. Thus, it can be seen that the distance between atoms is substantially constant in the crystal. On top of that, the grey area appears at a substantially constant angle ω and hardly shifts, which tells us that the average of the strain intensities is almost constant. These results reveal that the sample shown in FIG. 8 has little non-uniformity in strain distribution within a plane.

According to the preferred embodiment described above, since the In-doped layer 35 forms part of the $Al_dGa_eN$ layer 36, the non-uniform strain distribution that would otherwise be seen often in a conventional device can be reduced in this nitride-based semiconductor light-emitting device 100. In addition, a number of crystal defects to be caused by such a non-uniform strain distribution can also be reduced. As a result, non-uniform in-plane emission can be eliminated.

Next, the effects to be achieved by this preferred embodiment will be described. According to this preferred embodiment, since the $Al_xGa_yIn_zN$ crystal layer 30 is grown laterally over the air gap 25 as shown in FIG. 2(a), the density of dislocations in the $Al_xGa_yIn_zN$ crystal layer 30 may be low somewhere but may also be high elsewhere, and therefore, there is an in-plane strain distribution in that layer 30.

As shown in portion (a) of FIG. 9, a tensile strain may have been produced in regions 80 of the $Al_xGa_yIn_zN$ crystal layer 30, while a compressive strain may have been produced in other regions 81. Over that $Al_xGa_yIn_zN$ crystal layer 30, grown are an active layer 32 with an InGaN quantum well structure and an $Al_dGa_eN$ layer (i.e., overflow suppressing layer) 36. The present inventors discovered that such a non-uniform in-plane strain distribution was produced due to a delicate balance in strain between the active layer 32, the $Al_dGa_eN$ layer 36 and the underlying $Al_xGa_yIn_zN$ crystal layer 30 as shown in portion (b) of FIG. 9. We also discovered that such non-uniform strain distribution led to a non-uniform emission distribution within a plane, thus causing a decrease in quantum efficiency. With special attention paid to that strain balance, the present inventors discovered that the non-uniform strain distribution could be smoothed out and the quantum efficiency could be increased as shown in portion (c) of FIG. 9 by adding In to a part of the $Al_dGa_eN$ layer 36 that is located closest to the active layer 32.

Hereinafter, it will be described with reference to the accompanying drawings how different conventional and our (this invention's) approaches to the strain problem are. Portions (a) and (b) of FIG. 10 illustrate a conventional approach to the strain problem. In the arrangement shown in portion (a) of FIG. 10, a semiconductor layer 85, which is arranged over a substrate 86, has a compressive strain. To reduce that compressive strain, according to the conventional approach, first, a buffer layer 87 is formed on the substrate 86 and then the semiconductor layer 85 is formed thereon as shown in portion (b) of FIG. 10. As the buffer layer 87, a layer, of which the lattice constant is between those of the substrate 86 and the semiconductor layer 85, is used. According to this approach, by inserting the buffer layer 87, the lattice of the semiconductor layer 85 is relieved to the point that the compressive strain is reduced to a certain degree. However, as misfit dislocations and other crystal defects are also produced in the vicinity of the buffer layer 87, the crystallinity of the semiconductor layer 85 to be formed on the buffer layer 87 will also decrease.

On the other hand, portions (a) and (b) of FIG. 11 illustrate the approach adopted in this preferred embodiment to overcome the strain problem. As shown in portion (a) of FIG. 11, in this preferred embodiment, a semiconductor multilayer structure 88 arranged on a substrate 89 has a non-uniform strain distribution. And to smooth out that non-uniform strain distribution, according to this preferred embodiment, In is added to the overflow suppressing layer in the semiconductor multilayer structure 88 as shown in portion (b) of FIG. 11.

As described above, the conventional approach deals with unidirectional strain, while the approach of this preferred embodiment deals with the non-uniform strain distribution. On top of that, the conventional approach is adopted to reduce the strain but our approach is adopted to smooth out the non-uniform strain distribution, not to reduce the strain. In these respects, our approach is different from theirs.

Portions (a) and (b) of FIG. 12 show the concentrations of In that had been introduced into the $Al_dGa_eN$ layer 36 (i.e., the In concentration in the In-doped layer 35) and that was measured by SIMS (secondary ion mass spectrometry). In this graph, the ordinate represents the atomic concentration and the abscissa represents the depth as measured from the uppermost surface.

Portion (a) of FIG. 12 shows an example in which In was introduced so as to have varying concentrations. Specifically, a region at a depth of more than 0.5 μm under the surface, the dopant In had a concentration of $1.0 \times 10^{17}$ atms/cm$^3$, while a region at a depth of around 0.5 μm under the surface had an In concentration, which decreased gradually toward the surface and eventually went approximately zero. In the range that was doped with In, a region including In at a concentration of $1 \times 10^{16}$ atms/cm$^3$ to $1 \times 10^{19}$ atms/cm$^3$ is the In-doped layer 35. On the other hand, portion (b) of FIG. 12 shows an example in which In was introduced so as to have a constant concentration of $1.0 \times 10^{17}$ atms/cm$^3$. In these examples, the concentration of aluminum in the $Al_dGa_eN$ layer 36 falls within the range of $1.0 \times 10^{19}$ atms/cm$^3$ to $1.0 \times 10^{20}$ atms/cm$^3$. If In is introduced so as to have varying concentrations as shown in portion (a) of FIG. 12, the strain would be relieved so gently that the occurrence of defects could be further reduced. Consequently, according to this preferred embodiment, it is particularly preferred that In be introduced to have varying concentrations.

Hereinafter, the life of emission produced by GaN based semiconductor light-emitting devices will be described with reference to FIGS. 13(a) and 13(b). Specifically, FIG. 13(a) shows a result of evaluation that was carried out on a structure including a GaN layer (which corresponds to Comparative Example #1 to be described later) in place of the In-doped layer 35 in the semiconductor multilayer structure 100 shown in FIG. 2(a). On the other hand, FIG. 13(b) shows a result of evaluation that was carried out on the structure with the In-doped layer 35 shown in FIG. 12(b) (which corresponds to the structure of this preferred embodiment to be described later). In FIGS. 13(a) and 13(b), the ordinate represents the emission intensity (in arbitrary unit) and the abscissa represents a time delay (ns). FIG. 13(a) shows a result of measurement on a light-emitting device as a comparative example, which had an emission lifetime of 0.095 ns, while FIG. 13(b) shows a result of measurement on a light-emitting device of this preferred embodiment, which had an emission lifetime of 0.19 ns. Thus, the present inventors discovered that the emission lifetime could also be extended according to this preferred embodiment. An extended emission lifetime means that there are fewer non-radiative centers of recombination to be caused by defects, for example. Consequently, it can be confirmed, based on these results, that as the non-uniform strain distribution can be reduced according to this preferred embodiment, the occurrence of defects that would otherwise be caused due to such a non-uniform strain distribution can be minimized and the degree of crystallinity can be increased.

Next, the luminous efficacy of GaN based semiconductor light-emitting devices will be described with reference to FIG. 14, which is a table that summarizes luminous efficacy values measured. In this table, each luminous efficacy value is normalized on the supposition that the luminous efficacy of Comparative Example #1 that was excited at 383 nm is a unity. According to this measurement, a wavelength selective excitation was carried out. Thus, the result of measurement obtained by excitation at 383 nm indicates the quality of the well layers, while the result of measurement obtained by excitation at 366 nm indicates the quality of the interface. Comparative Example #1 has a structure in which the $Al_dGa_eN$ layer 36 includes no In-doped layer 35 and which includes a GaN layer in place of the In-doped layer 35. Comparative Example #2 has a structure that includes an InGaN layer in place of the In-doped layer 35. In Comparative Example #2, the InGaN layer has an In mole fraction of 2% and has a composition $In_{0.02}Ga_{0.98}N$, which includes In at a concentration of at least $2.0 \times 10^{19}$ atms/cm$^3$. The device of this preferred embodiment includes the In-doped layer 35 such as the one shown in portion (b) of FIG. 12 that is doped with In without varying its concentration.

As can be seen from FIG. 14, the quality of the well layers and the interfacial quality are both poor in Comparative Example #1, while the interfacial quality of Comparative Example #2 is rather good but the quality of the well layers thereof is bad. On the other hand, it can be seen that the interfacial quality and the quality of the well layers are both excellent according to this preferred embodiment. Consequently, this preferred embodiment is beneficial in terms of luminous efficacy, too.

On top of that, it was also confirmed that the nitride-based semiconductor light-emitting device of this preferred embodiment could reduce the operating voltage Vop by approximately 1 V compared to the conventional one and could cut down the power dissipation.

Hereinafter, it will be described with reference to FIGS. 15 through 20 how to fabricate the nitride-based semiconductor light-emitting device 100 of this preferred embodiment.

First of all, a substrate 10 is provided as shown in FIG. 15(a). In this preferred embodiment, a sapphire wafer is used as the substrate 10. But examples of other preferred substrates 10 include a gallium oxide wafer, an SiC wafer, an Si wafer, and a GaN wafer. According to this preferred embodiment, a number of crystal layers are sequentially deposited one after another on the substrate 10 by MOCVD (metalorganic chemical vapor deposition) process.

Next, as shown in FIG. 15(b), an $Al_uGa_vIn_wN$ layer 20 is formed on the substrate 10. A GaN layer may be deposited to a thickness of 3 μm as the $Al_uGa_vIn_wN$ layer 20. To form a GaN layer, a GaN low-temperature buffer layer is deposited on the sapphire substrate 10 by supplying $TMG(Ga(CH_3)_3)$ and $NH_3$ gases at 500° C. onto the substrate 10, the temperature is raised to 1,100° C., and then TMG and $NH_3$ gases are supplied.

Subsequently, as shown in FIG. 15(c), the surface of the $Al_uGa_vIn_wN$ layer 20 is selectively etched, thereby cutting recesses 22 through a portion of the $Al_uGa_vIn_wN$ layer 20. As this etching process, a chlorine-based dry etching process may be carried out, for example. The recesses 22 run in stripes in <1-100> directions and are arranged periodically in <11-20> directions. Those stripes may have a pitch of 15 μm, for example. When an LED is fabricated, the recesses 22 may have a square, rectangular or hexagonal planar shape and preferably have an interval of at least 2 μm in that case.

Thereafter, as shown in FIG. 16(a), a selective growth mask 23 of $SiN_x$ is made on the surface of each of those recesses 22. The mask 23 may have a thickness of 0.2 μm, for example.

Next, as shown in FIG. 16(b), an $Al_xGa_yIn_zN$ crystal layer 30 is formed. As the $Al_xGa_yIn_zN$ crystal layer 30, n-type GaN may be deposited to a thickness of 5 μm, for example. In that case, while the substrate, of which some areas are covered with the selective growth masks 23 and the other areas are the $Al_uGa_vIn_wN$ layer 20 exposed, is heated to a temperature of 1,100° C., TMG and $NH_3$ gases are supplied. As a result, n-type GaN grows laterally from seed crystal regions 24, on which the $Al_uGa_vIn_wN$ layer 20 is exposed, as a seed crystal. The $Al_xGa_yIn_zN$ crystal layer 30 that has grown laterally from the seed crystal regions 24 that are located on right- and left-hand sides of each recess 22 will eventually combine with each other over the recess 22, thereby turning the recess 22 into an air gap 25.

It should be noted that with the air gap 25 left, the $Al_xGa_yIn_zN$ crystal layer 30 and the selective growth mask can avoid contact with each other, thus minimizing the interfacial stress between them and decreasing the tilt angle of the crystallographic axis of the $Al_xGa_yIn_zN$ crystal layer 30. Consequently, the $Al_xGa_yIn_zN$ crystal layer 30 can have a lower density of dislocations. However, the air gap does not always have to be left and the $Al_xGa_yIn_zN$ crystal layer 30 may contact with the selective growth mask 23.

Subsequently, as shown in FIG. 17(a), an active layer 32 is formed on the $Al_xGa_yIn_zN$ crystal layer 30. In this example, the active layer 32 has a GaInN/GaN multi-quantum well (MQW) structure in which a number of $Ga_{0.9}In_{0.1}N$ well layers, each having a thickness of 34 nm, and a number of GaN barrier layers, each having a thickness of 6 nm, are alternately stacked on upon the other. In forming the $Ga_{0.9}In_{0.1}N$ well layers, the growth temperature is preferably lowered to 800° C. to introduce In.

Next, as shown in FIG. 17(b), an undoped GaN layer 34 is deposited to thickness of 30 nm, for example, on the active layer 32.

Thereafter, as shown in FIG. 18(a), an In-doped layer 35 is formed on the undoped GaN layer 34 as a part of the $Al_dGa_eN$ layer 36. Specifically, by supplying TMG, $NH_3$, TMA and TMI gases and Cp2Mg (cyclopentadienyl magnesium) as a p-type dopant, an In-doped $p\text{-}Al_{0.14}Ga_{0.86}N$ layer is deposited to a thickness of 70 nm as the In-doped layer 35. To smooth out the non-uniform strain distribution as effectively as possible, the In-doped layer 35 preferably has a thickness of 10 nm to 100 nm.

This effect of smoothing out the non-uniform strain distribution would be achieved by striking an adequate balance between the lattice strains inside the active layer 32 and inside the In-doped layer 35. That is why to smooth out the non-uniform strain distribution, the In-doped layer 35 should have strain energy that is high enough to affect the strain of the active layer 32. Generally speaking, the greater the thickness, the higher the strain energy. Specifically, if the In-doped layer 35 has a thickness of 10 nm or more, the strain energy of the In-doped layer 35 will have some influence on the active layer 32. And if the In-doped layer 35 has a thickness of 30 nm or more, the strain energy given by the In-doped layer 35 to the active layer 32 will have rather great influence, which is proved by results of elasticity calculations. However, if the In-doped layer 35 had a thickness of more than 100 nm, then excessive strain energy, which is almost as high as that of a layer including In as an essential constituent element, would be produced to lessen the expected effect. For that reason, the In-doped layer 35 preferably has a thickness of 100 nm or less.

The In-doped p-$Al_{0.14}Ga_{0.86}N$ layer to be the In-doped layer 35 is preferably grown at a low temperature (of 805° C. to 910° C., for example). By growing the layer at such a low temperature, the molar amount of In supplied can be kept rather small. The present inventors also discovered and confirmed via experiments that if the AlGaN layer started to be grown with In supplied and if the growth temperature was gradually raised from a relatively low temperature to a relatively high one with time, the crystallinity improved. In that case, the AlGaN layer may start to be grown at 910° C. and then the temperature may be raised to 940° C., for example.

According to this preferred embodiment, In may be introduced so as to have either varying concentrations or a constant concentration as shown in portion (a) or (b) of FIG. 12. If In is introduced to have varying concentrations, then In may be introduced to have a concentration of $1.0 \times 10^{17}$ atms/cm$^3$ (which is indicated as 1E+17 in the graph shown in portion (b) of FIG. 12) in an initial stage of the growth process, but the In concentration may start to gradually decrease at depth of around 0.5 μm under the surface and may go almost zero eventually. Alternatively, instead of varying the rate of In supplied, In may also be supplied at a constant rate but the growth temperature may be raised from a relatively low temperature to a relatively high one so that the concentration of In introduced gradually decreases and varies. If the concentration is varied in that way, the region with an In concentration of $1 \times 10^{16}$ atms/cm$^3$ through $1 \times 10^{19}$ atms/cm$^3$ will be referred to herein as the "In-doped layer 35". To further smooth out the non-uniform strain distribution, the In-doped layer 35 more preferably has an In concentration of $1 \times 10^{16}$ atms/cm$^3$ to $8 \times 10^{18}$ atms/cm$^3$.

The In-doped layer 35 of this preferred embodiment has an In concentration, which is on the order of a normal dopant concentration and which is lower than an In concentration (which is $1 \times 10^{20}$ cm$^{-3}$ or more and which may be $1 \times 10^{22}$ atms/cm$^3$, for example) in a situation where In is one of the essential constituent elements of a crystal.

According to this preferred embodiment, an MOCVD process is adopted as a method for growing the respective layers epitaxially. In this process, TMG is used as a source material for Ga and an organic metal such as TMA is used as source material for Al. The temperatures of those organic metals are controlled in a thermostat. By introducing a hydrogen gas into the thermostat, an organic metal in a number of moles to be determined by the temperature and vapor pressure at that point in time is decomposed and mixed with the hydrogen gas. In this case, by adjusting the flow rate of the hydrogen gas using a mass flow controller, the number of moles of the organic metal that reaches the substrate per unit time (which will be referred to herein as "molar amount of the source material supplied") is controlled. For example, when an InGaN layer is grown as the active layer 32 (i.e., if In is supplied as one of the essential constituent elements of a crystal), In needs to be supplied at a relatively high rate (e.g., to have a concentration of $1 \times 10^{22}$ atms/cm$^3$), and therefore, a 1000 cc/min mass flow controller is used. On the other hand, when the In-doped layer 35 of this preferred embodiment is grown, the required concentration of In (of $1.0 \times 10^{17}$ atms/cm$^3$, for example) is smaller than when the active layer 32 is grown. For that reason, if a 1000 cc/min mass flow controller were used in that case, then it would be difficult to control the rate of In supplied. Thus, in order to control the rate of supplying In appropriately enough to form the In-doped layer 35, it is preferred that a 10 cc/min mass flow controller be used and that the temperature of the thermostat be lowered than when the active layer 32 is formed. Thus, to grow the In-doped layer 35, one line and a mass flow controller are preferably provided for the manufacturing facility where the respective layers are grown.

Next, as shown in FIG. 18(b), the supply of In is stopped but TMA, TMG, NH$_3$ and Cp$_2$Mg gases are supplied continuously, thereby forming a p-$Al_{0.14}Ga_{0.86}N$ layer on the In-doped layer 35. In this manner, the $Al_dGa_eN$ layer 36 consisting of the In-doped layer 35 and the p-$Al_{0.14}Ga_{0.86}N$ layer is completed. The $Al_dGa_eN$ layer 36 preferably has a thickness of 10 nm to 200 nm. This thickness range is preferred for the following reasons. Specifically, if the thickness of the $Al_dGa_eN$ layer 36 were less than 10 nm, the overflow of electrons could not be reduced sufficiently. However, if the thickness of the $Al_dGa_eN$ layer 36 were more than 200 nm, then too much strain would be produced in the active layer 32. Also, it is preferred that the thickness of the In-doped layer 35 be a half or less of the overall thickness of the $Al_dGa_eN$ layer 36. Then, the non-uniform strain distribution can be smoothed out while maintaining the effect of suppressing the overflow of electrons.

Thereafter, as shown in FIG. 19, a p-type GaN layer 38 is deposited to a thickness of 0.5 μm on the $Al_dGa_eN$ layer 36. In forming the GaN layer 38, a Cp2Mg gas is supplied as a p-type dopant. After that, a contact layer 40 of p$^+$-GaN is formed on the GaN layer 38.

Subsequently, as shown in FIG. 20(a), a chlorine-based dry etching process is carried out to remove respective portions of the contact layer 40, GaN layer 38, $Al_dGa_eN$ layer 36, In-doped layer 35, undoped GaN layer 34 and active layer 32 and expose an area 30a of the $Al_xGa_yIn_zN$ crystal layer 30 in which an n-electrode is going to be formed. Next, Ti and Pt layers are stacked one upon the other to form an n-electrode 42 on that area 30a. Meanwhile, Pd and Pt layers are stacked one upon the other on the contact layer 40.

After that, as shown in FIG. 20(b), laser lift-off, etching, polishing and other techniques are used to remove the substrate 10, the $Al_uGa_vIn_wN$ layer 20, and even a portion of the $Al_xGa_yIn_zN$ crystal layer 30. In this case, only the substrate 10 could be removed or the substrate 10 and the $Al_uGa_vIn_wN$ layer 20 alone could be removed. Naturally, the substrate 10, $Al_uGa_vIn_wN$ layer 20, and $Al_xGa_yIn_zN$ crystal layer 30 could be left as they are without being removed at all. By performing these process steps, the nitride-based semiconductor light-emitting device 100 of this preferred embodiment is completed.

In the nitride-based semiconductor light-emitting device 100 of this preferred embodiment, when a voltage is applied between the n- and p-electrodes 42 and 41, holes will be injected from the p-electrode 41 into the active layer 32 and electrons will be injected from the n-electrode 42 into the active layer 32, thereby producing an emission at a wavelength of 450 nm, for example.

In the preferred embodiment described above, the $Al_dGa_eN$ layer 36 is supposed to have an Al mole fraction of 14 at % and the InGaN layer is supposed to have an In mole fraction of 10 at %. However, any other composition could be adopted as well. Also, the In-doped layer 35 and the p-$Al_dGa_eN$ layer 36 could be deposited directly on the active layer 32 with the undoped GaN layer 34 omitted.

Embodiment 3

Hereinafter, a third specific preferred embodiment of a nitride-based semiconductor light-emitting device according to the present invention will be described with reference to FIG. 21.

As shown in FIG. 21, the nitride-based semiconductor light-emitting device 200 of this preferred embodiment includes a GaN substrate 60 and a semiconductor multilayer structure 70 that has been formed on the GaN substrate 60.

The GaN substrate 60 of this preferred embodiment has been formed by carrying out an ELO process. Specifically, to obtain the GaN substrate 60, a thick GaN layer to be the GaN substrate may be deposited on a sapphire wafer (not shown) with its surface partially masked with silicon dioxide, for example, but with the rest of the surface exposed. In that case, once the GaN layer has been formed, the sapphire wafer may be removed. Alternatively, titanium may be deposited in a net pattern on a GaN layer that has been formed on the sapphire wafer and then a GaN layer to be the GaN substrate may be deposited thereon. According to this method, once the upper GaN layer is obtained, the lower one is separated using the titanium net as a boundary.

In this preferred embodiment, the GaN substrate 60 is formed by ELO process, and therefore, has a non-uniform strain distribution.

The semiconductor multilayer structure 70 has the same structure as the counterpart 50 of the second preferred embodiment described above. Specifically, there is an active layer 32, including an $Al_aIn_bGa_cN$ crystal layer (where a+b+c=1, a≥0, b≥0 and c≥0), over the $Al_xGa_yIn_zN$ crystal layer 30. In this case, the active layer 32 is an electron injected region of the nitride-based semiconductor light-emitting device 200. On the active layer 32, arranged is an $Al_dGa_eN$ layer 36 (where d+e=1, d>0, and e≥0) of a second conductivity type (e.g., p-type). In this preferred embodiment, the $Al_dGa_eN$ layer 36 is doped with Mg. Also, in this preferred embodiment, an undoped GaN layer 34 is sandwiched between the active layer 32 and the $Al_dGa_eN$ layer 36.

Also, an In-doped layer 35 forms at least a part of the $Al_dGa_eN$ layer 36. In the example illustrated in FIG. 21, the In-doped layer 35 forms the lower part of the $Al_dGa_eN$ layer 36. However, as in the first preferred embodiment described above, the In-doped layer 35 may also be located anywhere else in the $Al_dGa_eN$ layer 36.

On the $Al_dGa_eN$ layer 36 including the In-doped layer 35, arranged is a GaN layer 38 of the second conductivity type (e.g., p-type). And on the GaN layer 38, arranged is a contact layer 40, which is made of $p^+$-GaN in this preferred embodiment.

According to this preferred embodiment, by providing the In-doped layer 35, it is possible to prevent the semiconductor multilayer structure 70 from producing a non-uniform in-plane distribution of strain and to reduce the number of crystal defects to be caused by such a non-uniform strain distribution. As a result, non-uniform in-plane emission can be eliminated.

Furthermore, as such a non-uniform strain distribution is produced more easily in a non-polar GaN as described above, the significance of this preferred embodiment further increases in such an application.

Embodiment 4

Hereinafter, a fourth specific preferred embodiment of a nitride-based semiconductor light-emitting device according to the present invention will be described.

Currently, it is proposed that a substrate, of which the principal surface is a non-polar plane (e.g., a so-called m-plane" that is a (10-10) plane that intersects with the [10-10] directions at right angles), be used to make an LED or a laser diode. Such a substrate is called an "m-plane GaN substrate".

As shown in FIG. 22, the m-plane is parallel to the c-axis (defined by fundamental vector c) and intersects with the c-plane at right angles. In this case, the "m plane" is a generic term that collectively refers to a family of planes including (10-10), (−1010), (1-100), (−1100), (01-10) and (0-110) planes. Also, as used herein, the "X-plane growth" means epitaxial growth that is produced perpendicularly to the X plane (where X=c or m) of a hexagonal wurtzite structure. As for the X-plane growth, the X plane will be sometimes referred to herein as a "growing plane". Furthermore, a layer of a semiconductor that has been formed as a result of the X-plane growth will be sometimes referred to herein as an "X-plane semiconductor layer".

FIG. 23(a) schematically illustrates the crystal structure of a nitride-based semiconductor, of which the principal surface is a c plane, as viewed on a cross section thereof that intersects with the principal surface of the substrate at right angles. On the other hand, FIG. 23(b) schematically illustrates the crystal structure of a nitride-based semiconductor, of which the principal surface is an m plane, as viewed on a cross section thereof that intersects with the principal surface of the substrate at right angles. As shown in FIG. 23(a), a Ga atom layer and a nitrogen atom layer that extend parallel to the c plane are slightly misaligned from each other in the c-axis direction, and therefore, electrical polarization will be produced On the other hand, since Ga atoms and nitrogen atoms are present on the same atomic plane that is parallel to the m plane as shown in FIG. 23(b), no spontaneous electrical polarization will be produced perpendicularly to the m plane. That is to say, if the semiconductor multilayer structure is formed perpendicularly to the m-plane, no piezoelectric field will be produced in the active layer.

Just like the nitride-based semiconductor light-emitting device 100 shown in FIG. 2(a), the nitride-based semiconductor light-emitting device of this preferred embodiment also includes the GaN substrate 10 and the semiconductor multilayer structure 50 that has been formed on the GaN substrate 10. The nitride-based semiconductor light-emitting device of this preferred embodiment is characterized in that the respective principal surfaces of the GaN substrate 10 and semiconductor multilayer structure 50 are m-planes, not c-planes. Also, as in the first preferred embodiment described above, In is added to a portion of the $Al_dGa_eN$ layer 36 (i.e., the overflow suppressing layer) that is located on the GaN-based substrate 10 and close to the active layer 32.

Such a GaN substrate, of which the principal surface is an m-plane, may be obtained by growing a thick GaN crystal on a c-plane sapphire substrate, and then dicing the GaN crystal perpendicularly to the c plane of the sapphire substrate. Alternatively, a nitride-based semiconductor layer may be grown epitaxially on an m-plane GaN substrate. Even so, the nitride-based semiconductor layer also has an m-plane as its principal surface.

The configuration and manufacturing process of this preferred embodiment are quite the same as what has already been described for the first preferred embodiment except that the principal surfaces of the GaN substrate 10 and the semiconductor multilayer structure 50 are m-planes and that the selective growth is not carried out in this preferred embodiment. Thus, the description thereof will be omitted herein.

In an m-plane GaN substrate currently available, there is a distribution of dislocation densities within a plane. For example, the densities of dislocations in an m-plane GaN-based substrate may vary within the range of $10^5$ cm$^{-2}$ to $10^6$ cm$^{-2}$ within its plane, for example. And due to such a variation in the density of dislocations, there is a non-uniform strain distribution within a plane of the m-plane GaN substrate. That is why if a semiconductor layer is formed on such an m-plane GaN substrate, a non-uniform strain distribution will be produced within a plane of the semiconductor layer even if no selective growth is carried out. As a result, a semiconductor device that uses an m-plane GaN substrate will have a decreased quantum efficiency. When the present inventors actually irradiated such an m-plane GaN substrate with an X-ray, split peaks of X-ray diffraction were observed and it was confirmed that the degree of their split was greater than in a GaN substrate, of which the principal surface was a c-plane (which will be referred to herein as a "c-plane GaN substrate"). These results revealed that a more complicated non-uniform strain distribution was produced in an m-plane GaN substrate than in a c-plane GaN substrate. Consequently, as far as the m-plane GaN substrate is concerned, it is particularly important to smooth out such a non-uniform strain distribution.

FIG. 24 is a graph showing the emission spectrum of an m-plane Al$_d$Ga$_e$N layer (i.e., the overflow suppressing layer), to which In was added, at room temperature. For the purpose of comparison, the emission spectrum of an m-plane Al$_d$Ga$_e$N layer, to which no In was added, at room temperature is also shown in FIG. 24. The m-plane Al$_d$Ga$_e$N layer to which In was added had an In concentration of $7 \times 10^{17}$ cm$^{-3}$. It can be seen that the sample with the additive In clearly had a higher emission intensity and a better quantum efficiency than the sample with no additive In.

FIG. 25 is a table that summarizes relations between the concentration of In added to the m-plane Al$_d$Ga$_e$N layer (i.e., the overflow suppressing layer) and the emission intensity at room temperature. As can be seen from FIG. 25, if In was added to have a concentration of $3 \times 10^{16}$ cm$^{-3}$ to $8 \times 10^{18}$ cm$^{-3}$, the emission intensity increased and the quantum efficiency improved compared to a situation where no In was added. The quantum efficiency improved particularly significantly when the dopant concentration was in the range of $5 \times 10^{16}$ cm$^{-3}$ to $4 \times 10^{17}$ cm$^{-3}$.

While the present invention has been described with respect to preferred embodiments thereof, the disclosed invention may be modified in numerous ways and may assume many embodiments other than those specifically described above.

INDUSTRIAL APPLICABILITY

The present invention provides a GaN-based semiconductor light-emitting device that hardly has a non-uniform strain distribution.

REFERENCE SIGNS LIST 10 substrate
11 selectively grown layer
12 nitride-based semiconductor multilayer structure
13 active layer
14 Al$_d$Ga$_e$N layer
15 In-doped layer
20 Al$_u$Ga$_v$In$_w$N layer
22 recess region
23 selective growth mask
24 seed crystal region
25 air gap
30 Al$_x$Ga$_y$In$_z$N crystal layer
32 InGaN active layer
34 undoped GaN layer
35 In-doped layer
36 p-AlGaN layer
38 GaN layer
40 contact layer
41 p-electrode
42 n-electrode
50 semiconductor multilayer structure
60 Ga substrate
70 semiconductor multilayer structure
80 tensile strain region
81 compressive strain region
85 semiconductor layer
86 GaN substrate
87 buffer layer
88 semiconductor multilayer structure
89 GaN substrate

The invention claimed is:

1. A nitride-based semiconductor light-emitting device having a nitride-based semiconductor multilayer structure,
wherein the nitride-based semiconductor multilayer structure comprises:
an active layer including an Al$_a$In$_b$Ga$_c$N crystal layer (where a+b+c=1, a≥1, b≥0 and c≥0);
an overflow suppressing layer; and
an Al$_f$Ga$_g$N layer (where f+g=1, f≥0, and g≥0),
wherein the overflow suppressing layer is arranged between the active layer and the Al$_f$Ga$_g$N layer,
a portion of the overflow suppressing layer is obtained by doping Al$_d$Ga$_e$N (where d+e=1, d>0, e≥0, and f<d) with In at a concentration of $1 \times 10^{16}$ atoms/cm$^3$ to $8 \times 10^{18}$ atoms/cm$^3$,
an In concentration of the overflow suppressing layer other than the portion of the overflow suppressing layer is less than $1 \times 10^{16}$ atoms/cm$^3$,
peak of the concentration of In with which the Al$_d$Ga$_e$N is doped is within the overflow suppressing layer, and
the peak of the concentration of In is not at a face of the overflow suppressing layer.

2. The nitride-based semiconductor light-emitting device of claim 1, wherein the portion of the overflow suppressing layer is arranged closer to the active layer than to the Al$_f$Ga$_g$N layer.

3. The nitride-based semiconductor light-emitting device of claim 1, further comprising a selectively grown layer,
wherein the nitride-based semiconductor multilayer structure is arranged on the selectively grown layer, and
wherein the overflow suppressing layer is located on a side of the active layer opposite to the selectively grown layer.

4. The nitride-based semiconductor light-emitting device of claim 1, wherein the nitride-based semiconductor multilayer structure has an m plane as its principal surface.

5. The nitride-based semiconductor light-emitting device of claim 3, wherein the selectively grown layer is an Al$_x$Ga$_y$In$_z$N crystal layer (where x+y+z=1, x≥0, y≥0 and z≥0) that has grown from a surface region of an $Al_uGa_vIn_wN$ layer (where u+v+w=1, u≥0, v≥0 and w≥0), which is not covered with a mask layer.

6. The nitride-based semiconductor light-emitting device of claim 5, comprising:
   a substrate; and
   the $Al_uGa_vIn_wN$ layer, which has been formed on the substrate and which is partially covered with the mask layer,
   wherein the selectively grown layer is in contact with the surface region of the $Al_uGa_vIn_wN$ layer that is not covered with the mask layer.

7. The nitride-based semiconductor light-emitting device of claim 3, wherein another surface region of the $Al_uGa_vIn_wN$ layer that is covered with the mask layer defines a recess, and
   wherein the selectively grown layer is out of contact with the mask layer.

8. The nitride-based semiconductor light-emitting device of claim 3, wherein the selectively grown layer forms at least a part of a GaN substrate.

9. The nitride-based semiconductor light-emitting device of claim 1, wherein from a reference point within the portion of the overflow suppressing layer and closer to the active layer than to the $Al_fGa_gN$ layer, the more distant from the active layer, the lower the In concentration of the In-doped layer.

10. The nitride-based semiconductor light-emitting device of claim 1, wherein an undoped GaN layer is arranged between the active layer and the overflow suppressing layer.

\* \* \* \* \*